(12) United States Patent
Lister

(10) Patent No.: US 9,804,497 B2
(45) Date of Patent: Oct. 31, 2017

(54) SECURITY DEVICES AND METHODS OF MANUFACTURE THEREOF

(71) Applicant: DE LA RUE INTERNATIONAL LIMITED, Basingstoke (GB)

(72) Inventor: Adam Lister, Andover (GB)

(73) Assignee: DE LA RUE INTERNATIONAL LIMITED, Basingstoke (GB)

( * ) Notice: Subject to any disclaimer, the term of this patent is extended or adjusted under 35 U.S.C. 154(b) by 546 days.

(21) Appl. No.: 14/351,448

(22) PCT Filed: Oct. 11, 2012

(86) PCT No.: PCT/GB2012/052520
§ 371 (c)(1),
(2) Date: Apr. 11, 2014

(87) PCT Pub. No.: WO2013/054117
PCT Pub. Date: Apr. 18, 2013

(65) Prior Publication Data
US 2014/0306441 A1    Oct. 16, 2014

(30) Foreign Application Priority Data

Oct. 11, 2011    (GB) .................... 1117523.9

(51) Int. Cl.
| | | |
|---|---|---|
| G03F 7/20 | (2006.01) |
| G03F 7/38 | (2006.01) |
| G03C 5/08 | (2006.01) |
| G03C 5/60 | (2006.01) |
| B42D 25/41 | (2014.01) |
| B42D 25/42 | (2014.01) |
| B42D 25/29 | (2014.01) |
| B42D 25/342 | (2014.01) |

(52) U.S. Cl.
CPC ............. G03F 7/38 (2013.01); B42D 25/29 (2014.10); B42D 25/41 (2014.10); B42D 25/42 (2014.10); G03C 5/08 (2013.01); G03C 5/60 (2013.01); G03F 7/2002 (2013.01); B42D 25/342 (2014.10); B42D 2033/10 (2013.01); B42D 2033/14 (2013.01); B42D 2033/20 (2013.01); B42D 2033/30 (2013.01); B42D 2035/16 (2013.01); B42D 2035/20 (2013.01); B42D 2035/26 (2013.01); B42D 2035/44 (2013.01)

(58) Field of Classification Search
CPC ....................................... G03F 7/20
See application file for complete search history.

(56) References Cited

U.S. PATENT DOCUMENTS

| | | |
|---|---|---|
| 4,080,208 A | 3/1978 | Bialczak |
| 4,152,156 A | 5/1979 | Voisin et al. |
| 4,370,397 A | 1/1983 | Ceintrey et al. |
| 4,652,015 A | 3/1987 | Crane |
| 4,977,070 A * | 12/1990 | Winslow ............... G03C 1/825 430/151 |
| 5,795,643 A | 8/1998 | Steininger et al. |
| 6,176,522 B1 | 1/2001 | Jackson |
| 6,494,491 B1 | 12/2002 | Zeiter et al. |
| 2003/0124451 A1* | 7/2003 | Camillus ................ G03F 7/002 430/138 |
| 2004/0234816 A1 | 11/2004 | Azakami et al. |
| 2005/0240549 A1 | 10/2005 | Adamczyk et al. |
| 2007/0246932 A1 | 10/2007 | Heine et al. |

FOREIGN PATENT DOCUMENTS

| | | |
|---|---|---|
| CA | 2 490 834 A1 | 5/1997 |
| CA | 2 642 330 A1 | 8/2007 |
| CA | 2 667 081 A1 | 5/2008 |
| DE | 44 07 622 A1 | 9/1995 |
| DE | 102 43 863 A1 | 2/2004 |
| EP | 0 000 425 A1 | 1/1979 |
| EP | 0 059 056 A1 | 9/1982 |
| EP | 0 803 774 A1 | 10/1997 |
| EP | 0 860 298 A2 | 8/1998 |
| EP | 1 398 174 A1 | 3/2004 |

(Continued)

OTHER PUBLICATIONS

British Search Report issued in British Patent Application No. GB1117523.9 dated Feb. 1, 2012.
British Search Report issued in British Patent Application No. GB1117523.9 dated May 28, 2012.
British Search Report issued in British Patent Application No. GB1218242.4 dated Feb. 5, 2013.

(Continued)

*Primary Examiner* — Kathleen Duda
(74) *Attorney, Agent, or Firm* — Oliff PLC

(57) ABSTRACT

A method of manufacturing a security device including: conveying a substrate web including a photosensitive film along a transport path; exposing the photosensitive film to radiation of a predetermined wavelength through a mask, wherein the mask includes a predetermined pattern of regions which are substantially opaque to radiation of the predetermined wavelength and at least semi-transparent to radiation of the predetermined wavelength, respectively; during the exposure, moving the mask alongside the substrate web along at least a portion of the transport path at substantially the same speed as the substrate web, such that there is substantially no relative movement between the mask and the substrate web; and heating the substrate web including the exposed photosensitive film. In this way, regions of the photosensitive film exposed to the radiation of the predetermined wavelength undergo an increase in optical density such that the photosensitive film displays a reproduction of the predetermined pattern.

29 Claims, 17 Drawing Sheets

(56) References Cited

FOREIGN PATENT DOCUMENTS

| | | |
|---|---|---|
| EP | 1 897 700 A2 | 3/2008 |
| EP | 2 088 004 A1 | 8/2009 |
| GB | 2480227 A | 11/2011 |
| WO | WO 83/00659 A1 | 3/1983 |
| WO | WO 94/00298 A1 | 1/1994 |
| WO | WO 94/27254 A1 | 11/1994 |
| WO | WO 94/29119 A1 | 12/1994 |
| WO | WO 95/10419 A1 | 4/1995 |
| WO | WO 95/10420 A1 | 4/1995 |
| WO | WO 00/39391 A1 | 7/2000 |
| WO | WO 03/054297 A2 | 7/2003 |
| WO | WO 2005/052650 A2 | 6/2005 |
| WO | WO 2005/106601 A2 | 11/2005 |
| WO | WO 2006/125224 A2 | 11/2006 |
| WO | WO 2008/008635 A2 | 1/2008 |
| WO | WO 2008/061930 A1 | 5/2008 |
| WO | WO 03/095188 A2 | 11/2009 |
| WO | WO 2011/008287 A1 | 1/2011 |
| WO | WO 2011/051670 A2 | 5/2011 |
| WO | WO 2011/107782 A1 | 9/2011 |
| WO | WO 2011/107793 A1 | 9/2011 |

OTHER PUBLICATIONS

International Search Report issued in International Patent Application No. PCT/GB2012/052520 dated Mar. 1, 2013.
Written Opinion of the International Searching Authority issued in International Patent Application No. PCT/GB2012/052520 dated Mar. 1, 2013.

\* cited by examiner

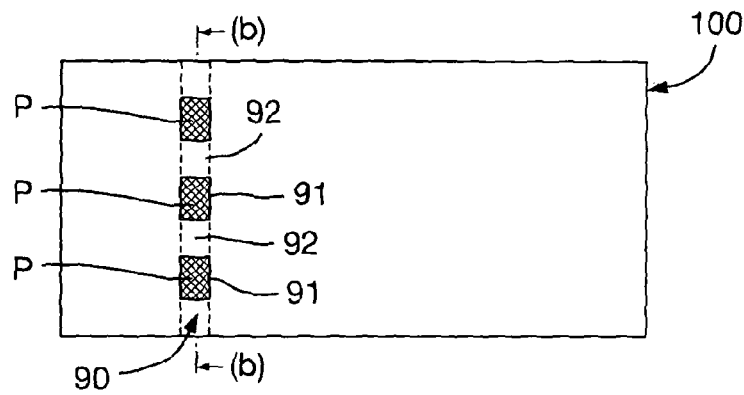
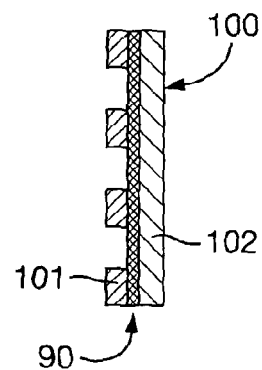
Fig. 27(a)  Fig. 27(b)
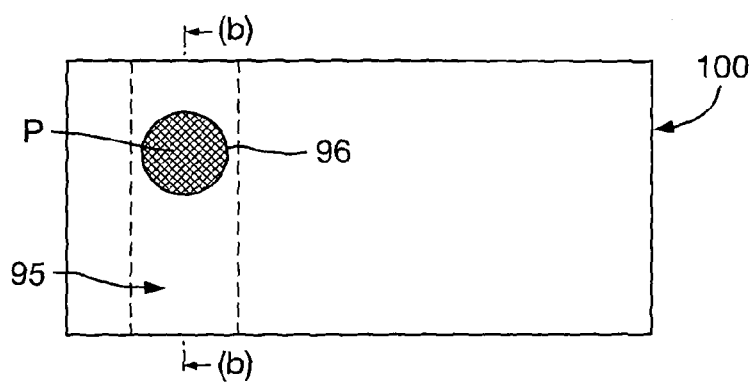
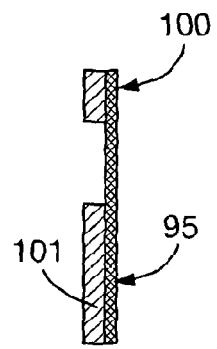
Fig. 28(a)  Fig. 28(b)
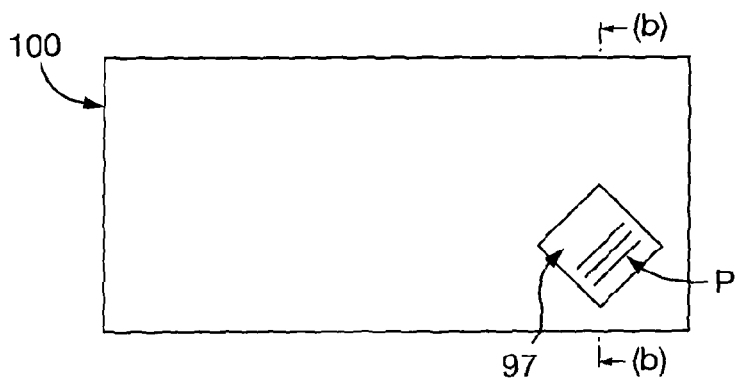
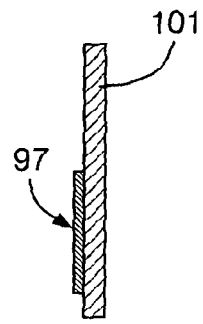
Fig. 29(a)  Fig. 29(b)

SECURITY DEVICES AND METHODS OF MANUFACTURE THEREOF

This invention relates to security devices for objects of value, such as documents of value including banknotes, cheques, passports, ID cards and the like, and methods of manufacturing security devices.

Objects of value, and particularly documents of value such as banknotes, cheques, passports, identification documents, certificates and licenses, are frequently the target of counterfeiters and persons wishing to make fraudulent copies thereof and/or changes to any data contained therein. Typically such objects are provided with a number of visible security devices for checking the authenticity of the object. Examples include printed features, such as microtext, fine line patterns and latent images where the security effect can be exhibited by a single layer of pattern elements; as well as more complex structures such as venetian blind devices, lenticular devices, moiré interference devices and moiré magnification devices, where interaction between two or more layers produces the secure visual effect. Other known security devices include holograms, watermarks, embossings, perforations and the use of colour-shifting or luminescent/fluorescent inks. Common to all such devices is that the visual effect exhibited by the device is extremely difficult, or impossible, to copy using available reproduction techniques such as photocopying. Security devices exhibiting non-visible effects such as magnetic materials may also be employed.

There is a constant need to improve the security level of security devices to stay ahead of potential counterfeiters. In order for a security device to be most effective, it must be readily distinguishable from copies or imitations and in the case of a visible security device this requires the device to exhibit a distinctive visual effect which is easily tested. Many of the known types of security device mentioned above depend for this effect upon the high resolution with which pattern elements of the device have been produced. For instance, microtext and fine line features rely on their elements having a higher resolution than is achievable using printing techniques available to would-be counterfeiters. Further, the varying appearance of latent images, venetian blind devices, lenticular devices, moiré interference devices and moiré magnification devices at different angles of view depend at least in part upon the closeness with which the pattern elements comprised in the device can be laterally placed.

For instance, in an exemplary moiré interference device, two sets of line elements are provided on either side of a transparent layer, overlapping one another. When viewed from one side, the interference between the two sets of lines gives rise to moiré bands which can be configured to take on recognisable images (through careful design of the two sets of lines). As the viewing angle is changed, due to the transparent layer spacing the two sets of lines from one another, the interference changes and the moiré bands are perceived to move. In order to obtain signification motion, the aspect ratio of the spacing between the two sets of lines (i.e. the thickness of the transparent layer) to the line spacing within each set must be high. If the aspect ratio is low, motion will only be visible if the device is tilted to a very high angle, thereby reducing the effectiveness of the device. Hence, to avoid the need for a very thick transparent layer, the line elements must be produced at a high resolution. More generally, many types of security device that exhibit a change in appearance (such as perceived motion or a "switch") when the viewing angle is changed are limited by the available resolution of pattern elements, with the result that the change in appearance can only be viewed at high angles of tilt. A higher resolution would enable motion or "switch" effects to become visible at much lower tilt angles, thereby significantly enhancing the visual impact of the device.

Typical printing processes used to manufacture pattern elements for security devices include intaglio, gravure, wet lithographic printing and dry lithographic printing. The achievable resolution is limited by several factors, including the viscosity, wettability and chemistry of the ink, as well as the surface energy, unevenness and wicking ability of the substrate, all of which lead to ink spreading. With careful design and implementation, such techniques can be used to print pattern elements with a line width of between 25 µm and 50 µm. For example, with gravure or wet lithographic printing it is possible to achieve line widths down to about 15 µm. However, consistent results at this resolution are difficult to achieve and in any case this level of resolution still imposes a significant limitation on the security device. Higher resolution elements (i.e. smaller line widths) would be highly desirable.

One approach which has been put forward as an alternative to the printing techniques mentioned above is used in the so-called Unison Motion™ product by Nanoventions Holdings LLC, as mentioned for example in WO-A-2005052650. This involves creating pattern elements ("icon elements") as recesses in a substrate surface before spreading ink over the surface and then scraping off excess ink with a doctor blade. The resulting inked recesses can be produced with line widths of the order of 2 µm to 3 µm. This high resolution produces a very good visual effect, but the process is complex and expensive. Further, limits are placed on the minimum substrate thickness by the requirement to carry recesses in its surface.

In accordance with the present invention, a method of manufacturing at least part of a security device comprises:
  conveying a substrate web comprising a photosensitive film along a transport path, the photosensitive film being adapted to exhibit an increase in optical density upon exposure to radiation of a predetermined wavelength and concurrent or subsequent heating, the increase in optical density being due to the formation of bubbles within the photosensitive film;
  exposing the photosensitive film to radiation of the predetermined wavelength through a mask, wherein the mask comprises a predetermined pattern of regions which are substantially opaque to radiation of the predetermined wavelength and at least semi-transparent to radiation of the predetermined wavelength, respectively;
  during the exposure, moving the mask alongside the substrate web along at least a portion of the transport path at substantially the same speed as the substrate web, such that there is substantially no relative movement between the mask and the substrate web; and
  heating the substrate web comprising the exposed photosensitive film;
whereby regions of the vesicular film exposed to the radiation of the predetermined wavelength undergo an increase in optical density such that the photosensitive film displays a reproduction of the predetermined pattern.

By "security device" we mean a feature which it is not possible to reproduce accurately by taking a visible light copy, e.g. through the use of standardly available photocopying or scanning equipment. Most preferably, the security device exhibits an optically variable effect, meaning that its appearance is different at different viewing angles. Depending on the nature of the selected visual effect, the predetermined pattern exhibited by the photosensitive film may by itself constitute a security device. For instance, the predetermined pattern may comprise microtext or, as discussed below, may form a latent image. In other examples, the exposed photosensitive film may go on to be combined with another component, such as a second pattern, a viewing mask or a focussing element, to form the complete security device from which the desired visual effect is visible.

Photosensitive films of the sort defined above are often referred to as "vesicular" films, and thus the photosensitive film will generally be referred to below as the vesicular film for brevity. Vesicular film is a type of photosensitive material which reacts to radiation of a particular corresponding wavelength causing the release of gas atoms or molecules within the film structure. Upon subsequent (or simultaneous) heating, the released gas migrates within the film, collecting to form bubbles (vesicles) which scatter light and hence locally increase the film's optical density. Thus when exposed to appropriate radiation through a patterned mask, a negative version of the pattern is transferred to the vesicular film. There is no "spreading" of the applied pattern, as is encountered in printing processes where the ink tends to spread beyond the intended application region, meaning that the achievable resolution is limited only by that of the mask. Techniques for producing patterned radiation masks of high resolution are well developed but generally not available to the would-be counterfeiter.

During testing, vesicular film patterns having line widths of around 5 µm have been produced, and it is expected that even higher resolutions will be achievable. Thus a security device formed by the patterned vesicular film or into which the patterned vesicular film is incorporated can readily be configured to generate a significantly enhanced secure visible effect as compared with counterpart devices based on printed patterns. Any type of security device that conventionally includes a printed pattern can advantageously be formed using instead a vesicular film using the presently disclosed principles. For instance, micro-text and other fine-line type devices can be produced to a much smaller scale than previously possible, requiring higher magnification for the features to be revealed and significantly increasing the difficulty of reproduction. More complex fine line designs also become possible. Optically variable devices, including latent images, venetian blind devices, lenticular devices, moiré interference devices, moiré magnification devices and the like can be produced with optimum aspect ratios no longer limited by the achievable resolution of the image elements. Alternatively, for such devices where the visual effect depends upon an aspect ratio involving the thickness of a transparent spacing layer, the overall visual effect can be maintained similar to that of a print-based device, but requiring a thinner spacing layer, thereby reducing the overall thickness of the device.

Unlike conventional photosensitive materials, vesicular films require only heating to "develop" the exposed pattern and no chemicals are required. This carries a number of significant benefits, including:

High manufacturing speed: a relatively short exposure time is required to transfer the pattern onto a vesicular film, compared with conventional photosensitive materials, and no long chemical development/drying steps are required;

Dry process: vesicular film is a dry, tack-free material unlike conventional photosensitive materials, which not only leads to a cleaner manufacturing line with lower maintenance needs, but also preserves the quality of the mask, which can otherwise become obscured leading to distorted reproduction of the pattern and hence a reduction in resolution;

Relatively inexpensive: due both to the required materials themselves and the less complex manufacturing line; and Reduced health and safety impact.

The web-based nature of the disclosed method allows for continuous production, with a high speed and high volume output. This ensures the viability of the process for manufacturing large quantities of identical security device components at an acceptable cost. This is vital for a successful security device since the visual effect produced by each device must be consistent in order that authentic devices can be readily distinguished from imitations. Further it becomes possible to produce items such as security threads and strips in the form of a continuous web ready for incorporation into a paper making process for example.

The substrate web could consist solely of the vesicular film if it is sufficiently thick so as to be self-supporting. However, in preferred examples, the substrate web comprises a support layer on which the vesicular film is carried, the support layer preferably being substantially transparent in the visible spectrum. The support layer may be provided solely to carry the vesicular film, or the support layer may play a role in producing the desired visual effect. For example, as discussed below, the support layer could comprise one or more focussing elements or could act as a spacing layer between components of the device. Generally it is preferred that the support layer is visually transparent so that the pattern carried by the vesicular film can be viewed from either side of the substrate web, but this is not essential. The unexposed vesicular film is also preferably substantially transparent in the visible spectrum, although it may carry a coloured tint.

The vesicular film may be present in the form of a contiguous layer extending across substantially the whole area of the support layer. This may be appropriate, for example, where the substrate is to be formed into a security article such as a thread or label. Alternatively, the vesicular film may be present in the form of isolated areas spaced across the surface of the support layer. For instance, the support layer may itself ultimately be formed into a document of value, in which case the security device may be restricted to a defined area such that data or other features can be provided on other regions of the substrate.

Preferably, the support layer is at least semi-transparent to radiation of the predetermined wavelength. This enables the vesicular film to be exposed through the support layer which improves the design freedom of the manufacturing line. However, as discussed below, in some cases it is more beneficial for the support layer to act as (or to include) a radiation shield, being substantially opaque to the predetermined wavelength.

The support layer could comprise any sheet material including paper, card, or metal foil, but in preferred examples, the support layer comprises a polymeric material, preferably polyethylene teraphthalate (PET) or biaxially oriented polypropylene (BOPP). Other suitable materials from which the support layer could be made include polyamide for example Nylon™, polyethylene, polymethylmethacrylate (PMMA), polyethylene naphthalate (PEN) or typical polymer banknote substrates such as BOPP or OPP (orientated polypropylene). The support layer could be monolithic or could itself be of a multilayer structure. Any combination of the above materials could be utilised.

Preferably, the vesicular film is on an outermost surface of the (unexposed) substrate web. This enables the vesicular film to be placed in direct contact with the mask during exposure, thereby achieving the highest possible resolution. As described below, additional layers or other features may be applied to the substrate web after the exposing has taken place, so the vesicular film may not remain on the outermost surface of the web once manufacturing is complete.

The thickness of the vesicular film influences both the degree by which its optical density will be increased by the exposure/heating process and the achievable resolution, and therefore must be selected in accordance with the desired visual effect. The thinner the film, the less "spreading" of the masked radiation will occur through the film, and hence the higher the resolution. However, thin films will give rise to fewer bubbles upon exposure and heating, and hence a lower optical density and thus poorer contrast. In preferred implementations, the (unexposed) vesicular film has a thickness perpendicular to the plane of the substrate web between 1 μm and 100 μm, preferably between 1 μm and 50 μm, more preferably between 1 μm and 20 μm, still preferably between 3 μm and 15 μm, most preferably around 3 to 10 μm. In a particularly preferred example, the vesicular film has a thickness of about 5 μm.

Any vesicular film composition could be used which produces an optical contrast due to the bubble generation mechanism described above. Preferred vesicular films comprise a diazo dye in a polymer matrix. For instance, one suitable vesicular film of this sort is the "vesicular microfilm" available from Exopack Advanced Coatings of Matthews, N.C., USA. However, other vesicular films utilising any vesicular chemistry, including those as may be developed in the future, would be equally viable.

Preferably, at least in the vicinity of the predetermined pattern on the mask, the mask and the substrate web are in contact with one another during the exposure to radiation, the mask preferably contacting the vesicular film. This achieves the highest level of resolution transfer from the mask to the vesicular film and also reduces the risk of any slippage occurring between the film and mask during exposure.

The mask could be provided in a number of ways, including as a plate or belt which is conveyed alongside the substrate web. However, in particularly preferred implementations, the mask is provided on a circumferential surface of a patterning roller, and the transport path includes at least a portion of the circumferential surface of the patterning roller, and wherein at least during the exposing of the vesicular film to radiation, the patterning roller rotates such that its circumferential surface travels at substantially the same speed as the substrate web. In this way, the mask forms an integral part of the transport path and the construction of the manufacturing line is simplified.

Preferably, the patterning roller comprises a support roller which is at least semi-transparent to radiation of the predetermined wavelength, at least in the vicinity of the predetermined pattern. For example, the support roller may be a quartz or glass cylinder (hollow or solid). The mask could be either integral with or separable from the support roller. In one advantageous implementation, the mask comprises a masking sheet, carried by the support roller, of which at least a region is substantially opaque to radiation of the predetermined wavelength so as to define the predetermined pattern, wherein the mask is preferably separable from the support roller. This enables the production of different patterns using the same basic apparatus, replacing the mask as appropriate. Advantageously, the masking sheet is flexible so as to conform to the exterior or interior surface of the support roller. In this way, the mask can be patterned whilst flat using conventional laser etching or photopatterning techniques, and then affixed to the support roller. Alternatively, the mask could be formed into a cylindrical shape before mounting to the support roller.

The mask could comprise a radiation-opaque material such as a metal sheet with appropriate cut-outs to define the pattern. However, it is preferred that the masking sheet comprises a carrier layer which is at least semi-transparent to radiation of the predetermined wavelength and a masking layer, present only in the region(s) corresponding to the predetermined pattern, which is substantially opaque to radiation of the predetermined wavelength. This arrangement is more durable and results in less surface relief which, if the mask is arranged to directly contact the substrate web in use, could otherwise damage the web. In particularly preferred examples, the carrier layer comprises a polymeric material, preferably PET or BOPP, each of which has an appropriate transparency and degree of flexibility.

The masking layer could take any form capable of absorbing radiation of the predetermined wavelengths. In preferred examples, the masking layer comprises a patterned metallisation, preferably a photo-patterned or laser-etched metallisation.

In alternative embodiments, the mask preferably comprises one or more markings formed on or in the circumferential surface of the support roller, the or each marking being substantially opaque to radiation of the predetermined wavelength, the marking(s) defining the predetermined pattern. Here, the mask is not separable from the support roller, but the durability of the mask can be increased.

Preferably, the transport path is configured to wrap around at least a portion of the patterning roller, whereby the substrate web is urged against the circumferential surface of the patterning roller. This reduces the risk of any slippage between the mask and the substrate web, and also improves the resolution of the transferred pattern due to the close proximity of the mask and the web. Advantageously, this may be assisted by providing at least one tensioning roller in the transport path.

The wavelength of the radiation used to expose the pattern depends on the chemistry of the vesicular film. In preferred examples, the predetermined wavelength is in the ultraviolet (UV) to violet range of the spectrum, preferably between 10 nm and 460 nm, preferably between 380 and 410 nm, to which at least the diazo-based vesicular films mentioned above are responsive. More generally, the predetermined wavelength should preferably be outside the visible spectrum so that the exposed film can be shielded from wavelengths to which it is responsive (as discussed below) without concealing the pattern from view. However it is acceptable if the vesicular film is also responsive to a minor portion of the visible spectrum (e.g. violet) since such wavelengths can also be blocked without preventing viewing of the pattern The intensity of the exposure influences the degree of optical density achieved, in combination with other factors including the duration of exposure and the temperature and duration of heating. In preferred examples, the radiation to which the vesicular film is exposed has a power between 50 and 300 W, preferably between 100 and 200 W, more preferably between 100 and 150 W, most preferably around 120 VV. Generally, the greater the exposure power, the shorter duration of exposure that is required. In preferred examples, each exposed region of the vesicular film is exposed to the radiation for a duration of less than 5 seconds, preferably less than 1 second, more preferably less than 0.1 seconds, still preferably between 0.01 and 0.05 seconds.

A radiation source for carrying out the exposure can be arranged in any configuration suitable for the mask geometry. Where the mask is on a patterning roller, exposing the vesicular film to the radiation is advantageously achieved using a radiation source located inside the patterning roller, preferably a UV lamp.

The heating step could be carried simultaneously with the exposing through the mask, or subsequently. If subsequent, it is advantageous that there is not too long a delay between the exposing and the heating, to avoid the released gas molecules leaching out of the material before forming bubbles. This could reduce the degree of bubble formation and hence the contrast achieved in the pattern. Therefore, preferably, the heating step takes place no more than 2 hours after the step of exposing the photosensitive film through the mask, more preferably no more than 1 hour, yet more preferably no more than 10 minutes, still preferably no more than 1 minute, most preferably substantially immediately after the step of exposing the photosensitive film through the mask.

The temperature and duration of heating requires careful selection in order to obtain optimum bubble size and hence optical density. At too low a temperature or too short a duration, the bubbles formed will be too small and few in number to sufficiently increase the film's optical density. However, if heated for too long or at too high a temperature, the bubble size may increase to such an extent that little light scattering occurs. Therefore, in preferred examples, during the heating step the substrate web is heated to a temperature between 50° C. and 300° C., preferably between 60° C. and 200° C., more preferably between 70° C. and 150° C., still preferably between 110° C. and 140° C. Advantageously, each exposed region of the substrate web is heated for a duration between 1 and 120 seconds, preferably between 1 and 90 seconds, more preferably between 1 and 70 seconds, still preferably between 5 and 30 seconds. This can be adjusted for example by varying the speed with which the substrate web is conveyed through an oven.

The pattern carried by the mask and transferred to the vesicular film can take any desired form as required in order to achieve the desired security effect. In general, the predetermined pattern is preferably configured to exhibit a secure visual effect (i.e. one which cannot readily be copied by standard processes such as photocopying), preferably an optically variable effect (i.e. an appearance which varies at different viewing angles), alone or in combination with a viewing component such as a second pattern, a masking grid, a focussing element or array of focussing elements. For example, the pattern may comprise micro-text, an array of line elements, or an array of microimage elements. Preferably, the predetermined pattern includes one or more regions having a minimum dimension (e.g. line width) of no more than 50 μm, preferably no more than 25 μm, more preferably no more than 15 μm, still preferably no more than 10 μm, most preferably no more than 5 μm. Any viewing component required to generate the desired optical effect may be incorporated in or applied to the substrate web as discussed below, but could alternatively be comprised in an object such as a document of value into or onto which the substrate web is ultimately fitted, or could be part of a standalone device, such as a reader or decoder for testing the authenticity of the substrate web.

The visible pattern formed on the vesicular film is sufficient as the basis for many types of security element. However, the present inventors have found that the exposed regions of the vesicular film not only undergo an increase in optical density but typically also show a raised surface profile relative to the unexposed film, provided the dosage of radiation and heat is sufficient. This surface relief can be used to provide further secure visual effects, such as latent images. Therefore, in particularly preferred examples, the exposure of the vesicular film to radiation and the heating of the substrate web in combination are sufficient to give rise to a raised surface relief in the exposed regions of the vesicular film.

The height of the raised areas depends on a number of factors including the film thickness, the lateral dimensions of the feature in question (e.g. line width) as well as the exposure and heating parameters. Generally, the raised features have been found to have a varying profile with gently sloping sides and a maximum height around the centre of the exposed region. In preferred examples, the exposed regions of the vesicular film have a maximum relief height, relative to the unexposed regions of the vesicular film, of at least 5 μm, preferably at least 10 μm, more preferably at least 15 μm, still preferably at least 20 μm, most preferably at least 25 μm.

If the wavelength to which the vesicular film is responsive is in common use and/or will be encountered in ambient surroundings (e.g. UV), it is desirable to shield the exposed vesicular film so that the transferred pattern is not obliterated by subsequent exposure and possible heating. For instance, bank notes are required to withstand a hot air test at 120° C. for 30 minutes which, if a patterned diazo-based vesicular film has been exposed all-over to sunlight, would likely destroy the pattern (the whole area of the film undergoing the above-described increase in optical density). Therefore, one or more shielding layers are preferably incorporated into the security device and/or into the object (e.g. document) which is ultimately to carry the device.

This can be achieved in a number of ways. In a first preferred example, the substrate web further comprises a shielding layer on one side of the vesicular film which is substantially opaque to radiation of the predetermined wavelength, the vesicular film being located between the shielding layer and the mask during exposure. The shielding layer could be a multi-functional layer also acting as a support layer and/or a viewing layer (such as one or more focussing elements). This has the advantage that no additional process steps are required, since the unexposed substrate web already includes the shield. However, this approach can only be used to shield the vesicular film from one side and therefore it is generally necessary to provide a second shielding layer either by application to the exposed substrate web or as part of an object into which the device will be incorporated.

Therefore in another preferred implementation, the method further comprises, after exposing the vesicular film, applying a shielding layer to one or both sides of the substrate web at least in the vicinity of the displayed pattern, the shielding layer being substantially opaque to radiation of the predetermined wavelength and preferably at least semi-transparent in the visible spectrum. This may take place before or after heating of the web to develop the pattern.

Suitable shielding layers could comprise for example a resin containing a UV absorbing substance at an appropriate concentration. For instance, a resin such as vinyl polymer could be used as the binder, with a UV absorber such as titanium dioxide ($TiO_2$) or certain proprietary materials such as Tinuvin 326™ or Tinuvin P™ by BASF plc. Alternatively, yellow dyes have been found to have suitable UV absorbing properties and can be used to good effect. The shielding layer can be applied by any suitable coating process, including printing, painting, extrusion, lamination etc, or by passing the web through a bath of the shielding material.

Alternatively or in addition to the use of a shielding layer, additional processing steps can be carried out after formation of the pattern in the photosensitive film to deactivate the film and prevent any further patterning. In particularly preferred examples, this is achieved by, after the heating step:
  (i) exposing the photosensitive film to radiation of the predetermined wavelength; and then
  (ii) maintaining the exposed photosensitive film at temperatures sufficiently low to so as not to give rise to the formation of bubbles for a sufficient duration after which elevation to higher temperatures does not cause the formation of bubbles.

In step (i), previously unexposed regions of the film are exposed to release gas in the manner described above. However, instead of heating the film, the film is then kept at temperatures which do not promote gas migration, e.g. left at ambient room temperature, for a period of time which is sufficiently long that the released gas leaches out of the film without forming significant bubbles. Following this, subsequent exposure and/or heating will have no or negligible effect on the film, thereby effectively fixing the predetermined pattern and preventing alteration.

Preferably, in step (i), substantially the whole of the photosensitive film is exposed to radiation of the predetermined wavelength. However, in theory only those portions of the film which were not exposed during the patterning need be exposed during step (i). Moreover, any portions of the film which will not ultimately form part of the security device or will not be visible in the final arrangement of the device need be exposed.

The conditions under which the film should be maintained in step (ii) will depend on the particular chemistry of the photosensitive film as well as its dimensions (particularly its thickness). Appropriate conditions can be determined empirically by carrying out step (ii) at different temperatures and durations and then heating at least to temperatures similar to those used during patterning, and the film examined to determine whether any further bubbles have been formed. In preferred examples, step (ii) comprises maintaining the exposed photosensitive film at temperatures below 70 degrees C., preferably below 50 degrees C., more preferably below 25 degrees C. for at least 2 hours, preferably at least 4 hours, more preferably at least 8 hours. For example, the twice exposed film may be stored overnight at room temperature. It should be noted that the maintaining step does not require active control of the temperature conditions, although in hot environments this may be desirable.

The disclosed patterning technique also lends itself particularly well to devices where two overlapping patterns are required to give rise to a visual effect, since the unexposed vesicular film is generally visually transparent. Hence in particularly preferred implementations, the substrate web comprises first and second vesicular films each as already defined, separated by one or more layers which are at least semi-transparent in the visible spectrum, preferably including a support layer. In this way, the above-described method can be used to transfer high resolution patterns to both vesicular layers which, if positioned to overlap, can be viewed one through the other. This is the basis for many types of security device, including venetian blinds, animation effects and moiré interference devices.

In some cases, it is desirable that the one or more layers separating the first and second vesicular films are at least semi-transparent to radiation of the predetermined wavelength, whereby both the first and second vesicular films are exposed to radiation through the predetermined pattern simultaneously, such that both films display substantially the same pattern. This ensures that the two patterns will be precisely in register with one another and an optically variable venetian blind effect can be achieved in this way, where the device will appear light when viewed straight-on (due to light transmission in the regions between the pattern elements) and dark when tilted to an angle at which the neighbouring elements of the two patterns align to block the passage of light.

However, for more complex optical effects it is generally preferred to utilise two different overlapping patterns, or at least two copies of a pattern out of phase with one another, and so it is desirable to be able to form different patterns in each of the two vesicular films. Therefore, in particularly preferred implementations, at least one of the one or more layers separating the first and second vesicular films is substantially opaque to radiation of the predetermined wavelength, whereby only the first vesicular film is exposed to radiation through the predetermined pattern during the exposure step, and the method further comprises:
  exposing the second vesicular film to radiation of the predetermined wavelength through a second mask, the second mask comprising a second predetermined pattern of regions which are substantially opaque to radiation of the predetermined wavelength and at least semi-transparent to radiation of the predetermined wavelength, respectively; and
  during the exposure of the second vesicular film, moving the second mask alongside the substrate web along at least a portion of the transport path at substantially the same speed as the substrate web, such that there is substantially no relative movement between the second mask and the substrate web,
whereby, after heating, the first vesicular film displays a reproduction of a first predetermined pattern defined by the mask through which the first vesicular film is exposed, and the second vesicular film displays a reproduction of the second predetermined pattern.

The second exposing step can be performed in a number of ways but generally it is preferred that the mask through which the first vesicular film is exposed and the second mask are located on opposite sides of the transport path. In one advantageous implementation, the first and second predetermined patterns on the masks are arranged to oppose one another, the exposure of the first and second vesicular films in any one location along the substrate web occurring simultaneously. This ensures highly accurate registration between the two patterns. Alternatively, in another preferred implementation, the second predetermined pattern on the second mask is located downstream from the first predetermined pattern on the mask through which the first vesicular film is exposed, whereby the exposure of the first vesicular film and the exposure of the second vesicular film are sequential.

The first and second masks could be configured differently to one another. However, preferably, the second mask is provided on a circumferential surface of a second patterning roller, and the transport path further includes at least a portion of the circumferential surface of the second patterning roller, and wherein at least during the exposing of the second vesicular film to radiation, the second patterning roller rotates such that its circumferential surface travels at substantially the same speed as the substrate web.

The spacing between the two patterns (perpendicular to the plane of the substrate web) will be chosen in conjunction with the pattern design in order to achieve the desired visual effect. However in preferred examples, the one or more layers separating the first and second vesicular films have a combined thickness of between 10 µm and 100 µm, preferably between 10 µm and 50 µm, more preferably between 15 µm and 40 µm, still preferably between 20 µm and 30 µm.

Depending on the design of the two patterns, different secure visual effects can be achieved. In one example, the predetermined patterns displayed by the first and second vesicular films form in combination a moiré interference device whereby the appearance of the device differs at different angles of view. Principles of operation of moiré interference devices are described for example in U.S. Pat. No. 6,494,491. In another example, the pattern displayed by one of the vesicular films may act as a masking grid through which selected portions of the other pattern are visible, the visible portions changing at different angles of view, e.g. to display an animation.

Various different effects can also be achieved using a single patterned vesicular film in combination with a viewing component overlapping (i.e. overlying or underlying) the pattern. This could be incorporated into the substrate web or could be provided as part of an object (such as a document of value) onto or into which the substrate web is ultimate applied or incorporated, to thereby complete the security device. The viewing component could itself comprise a pattern of visible elements, such as the masking grid described above, but can be fabricated using any appropriate technique including conventional printing methods or metallisation. Particularly strong optical effects can be achieved where the viewing component comprises one or more focussing elements, such as lenses or mirrors. For example, in one preferred implementation, the substrate web further comprises one or more focussing elements, or the method further comprises arranging one or more focussing elements to overlap the substrate web, the vesicular film lying substantially in the focal plane of the focussing element(s), whereby a focussed image of at least part of the predetermined pattern is generated by the focussing element(s). Advantageously, the focussing element(s) and predetermined pattern displayed by the vesicular film form in combination a lenticular device. For example, the predetermined pattern may comprise elements of a first image and elements of a second image arranged such that when the lenticular device is viewed from a first angle, a focussed version of the first image is generated, and when the lenticular device is viewed from a second angle, a focussed version of the second image is generated. In this way, the device can be configured to exhibit a "switch" from the first image to the second image at a particular angle of view. More than two images can be provided to enable multiple "switches" at successive viewing angles and the images may be designed to give the appearance of an animation as the viewing angle changes. Further details and examples of lenticular devices which could be formed using a vesicular film in this way are given in our International application WO-A-2011051670.

In another preferred example, the substrate web further comprises a regular array of micro-focussing elements, or the method further comprises arranging a regular array of micro-focussing elements to overlap the substrate web, the vesicular film lying substantially in the focal plane of the micro-focussing elements, and the predetermined pattern displayed by the vesicular film comprising a corresponding array of microimage elements, wherein the pitches of the micro-focusing elements and the array of microimage elements and their relative locations are such that the array of micro-focusing elements cooperates with the array of microimage elements to generate a magnified version of the microimage elements due to the moiré effect, the array of micro-focussing elements and predetermined pattern forming in combination a moiré magnification device. Examples of moiré magnification devices and effects that can be achieved are described in EP-A-0698256, WO-A-2005106601 and in our International Patent Application No. PCT/GB2011/050398, and the presently disclosed technique can be utilised to form the microimage elements described therein.

An optically variable effect can also be exhibited by a single patterned vesicular film alone if use is made of the surface relief mentioned above. In one preferred implementation, the predetermined pattern displayed by the vesicular film comprises a plurality of spaced exposed regions of increased optical density, each exposed region having a raised surface relief, configured such that the appearance of the predetermined pattern varies depending on the viewing angle due to the raised regions concealing the intervening spaces to a greater or lesser extent, whereby the predetermined pattern forms a latent device. Since the raised (exposed) regions will be relatively opaque compared with the intervening (unexposed) spaces, the pattern will appear light when viewed straight on in transmission and relatively dark when viewed at an angle. In particular preferred examples, the pattern may comprise at least two areas, each area exhibiting a set of line elements, the line elements in a first area being arranged substantially orthogonal to those in a second area. In this way, when the device is viewed at an angle aligned with the line elements of the first area, the first area will appear dark or light relative to the second area (depending on the position of the light source relative to the device and to the viewer). When the device is rotated or tilted so as to be viewed at an angle aligned with the line elements of the second area, the effect will be reversed. The first and second areas can be configured to define a graphic, such as text or an image, which will be largely concealed when viewed straight-on, and revealed when viewed at an angle, exhibiting a switch between negative and positive versions of the graphic depending on the viewing position. Preferably, the distance by which the regions (e.g. line elements) are spaced is substantially equal to the maximum height of the regions, which ensures that the change in appearance is visible at relatively low tilt angles (e.g. 45 degrees). This is generally difficult to achieve with conventional relief-forming printing processes such as intaglio, due to the low resolution.

The security device may be combined with one or more additional security features and in preferred examples, the provided substrate web comprises one or more of the following, or the method further comprises applying one or more of the following to the substrate web:

An optically variable diffraction structure, preferably a diffraction grating or hologram;

An optically variable material, preferably an interference layer device, interference layer pigments or pearlescent pigments, or cholesteric liquid crystal layers or pigments; and Luminescence, fluorescent, magnetic or thermochromic materials;

each of which may or may not overlap the vesicular film or the region(s) of the vesicular film which have been or will be exposed. That is, the additional feature(s) may provide an effect which is independent of or combined with that to which the patterned vesicular film contributes.

It is also preferred that the device is arranged to be machine-readable. This may be achieved in a number of ways. For example at least one layer of the device (optionally as a separate layer) may further comprise machine-readable material. Preferably the machine-readable material is a magnetic material, such as magnetite. The machine-readable material may be responsive to an external stimulus. Furthermore, when the machine-readable material is formed into a layer, this layer may be transparent. Detectable materials that react to an external stimulus include but are not limited to fluorescent, phosphorescent, infrared absorbing, thermochromic, photochromic, magnetic, electrochromic, conductive and piezochromic materials.

The exposed substrate web may undergo additional processing steps which differ depending on how the security device is ultimately to be formed and/or handled. In many cases the processed substrate web will be output as a security article which can go on to be applied to or incorporated into an object of value, such as a document of value. In this context, a "security article" is an item such as a thread, strip, label, foil, patch or the like, which can be incorporated into an object to enable its authenticity to be tested by way of a secure effect exhibited. Security threads are now present in many of the world's currencies as well as vouchers, passports, travellers' cheques and other documents. In many cases the thread is provided in a partially embedded or windowed fashion where the thread appears to weave in and out of the paper. One method for producing paper with so-called windowed threads can be found in EP0059056. EP0860298 and WO03095188 describe different approaches for the embedding of wider partially exposed threads into a paper substrate. Wide threads, typically with a width of 2 to 6 mm, are particularly useful as the additional exposed area allows for better use of overt security features such as those formed using the currently disclosed techniques.

However, it should be noted that, by itself, the security article may or may not exhibit a secure effect (i.e. act as a security device). For instance, if one or more components necessary to generate the visual effect are provided in the object of value rather than the substrate web, the security device may only be completed once the security article is combined with the object. However, in many cases it is preferred that whilst it is preferred that the substrate web itself carries all components necessary to view the desired optical effect generated by the pattern, in which case the security article will indeed include a security device. In a first preferred example, the exposed substrate web constitutes a security article for application onto or incorporation into an object of value, preferably a document of value, the security article preferably taking the form of a thread, strip or band. As such, once the web has been exposed and any additional components applied to it (e.g. a shielding layer), the substrate web or portions thereof can be directly applied to or incorporated into an object of value.

In a particularly preferred example, the method further comprises applying the exposed substrate web onto or incorporating the substrate web into a sheet material to form a security sheet suitable for the production of documents of value, and preferably then cutting the security sheet into individual documents. For example, a reel of the exposed substrate web can be fed into a paper-making process to incorporate the substrate web as a thread within the paper sheet.

In other preferred examples, the method further comprises cutting the exposed substrate web into individual security articles for application onto or incorporation into an object of value, preferably a document of value, each security article including at least one reproduction of the predetermined pattern(s) displayed by the vesicular film of the substrate web, the security articles preferably taking the form of a foil, patch, thread, strip or insert. The or each security article can then be applied onto or incorporated into one or more objects of value, preferably documents of value. Again, the individual security articles may or may not carry completed security devices.

In another preferred example, the substrate web constitutes a transfer band, comprising a carrier layer and a release layer between the vesicular film and the carrier layer, portions of at least the vesicular film constituting security articles, each security article including at least one reproduction of the predetermined pattern(s) displayed by the vesicular film of the substrate web, the security articles preferably taking the form of labels or transfer foils in the form of patches or stripes. The or each security article can then be detached from the carrier layer and affixing the or each security article onto one or more objects of value, preferably documents of value. This could be performed by hot stamping or, if the articles are formed as stickers, each may simply be peeled off the carrier and adhered to the object, manually or otherwise. If the security device is to be used in a label application it will typically require the application of a heat or pressure sensitive adhesive to the outer surface of the device which will contact the secure document. In addition an optional protective coating/varnish could be applied to the exposed outer surface of the device. The function of the protective coating/varnish is to increase the durability of the device during transfer onto the security substrate and in circulation.

In the case of a transfer element rather than a label the security device is preferably prefabricated on a carrier substrate and transferred to the substrate in a subsequent working step. The security device can be applied to the document using an adhesive layer. The adhesive layer is applied either to the security device or the surface of the secure document to which the device is to be applied. After transfer the carrier strip can be removed leaving the security device as the exposed layer or alternatively the carrier layer can remain as part of the structure acting as an outer protective layer. A suitable method for transferring security devices based on thick devices comprising micro-optical structures is described in EP 1897700.

Due to the generally transparent nature of the unexposed vesicular film, many of the optical effects achieved are advantageously viewed in transmission or from both sides of the finished devices. Therefore the method preferably further comprises applying the security article to or incorporating the security article into a sheet material, preferably a document of value, in alignment with at least one window provided in the sheet material before or after affixing of the security article, whereby at least one reproduction of the predetermined pattern(s) displayed by the vesicular film of the substrate web is visible from at least one side, preferably both sides, of the sheet material, through the window. The sheet material could, for example, go on to form the basis of a document of value such as a banknote or page of a passport, or another object of value such as a tag for attachment to products such as clothing, etc. The security document may have a substrate formed from any conventional material including paper and polymer. Techniques are known in the art for forming transparent regions in each of these types of substrate. For example, WO8300659 describes a polymer banknote formed from a transparent substrate comprising an opacifying coating on both sides of the substrate. The opacifying coating is omitted in localised regions on both sides of the substrate to form a transparent region.

EP1141480 describes a method of making a transparent region in a paper substrate. Other methods for forming transparent regions in paper substrates are described in EP0723501, EP0724519, EP1398174 and WO03054297.

As noted above, whilst it is usually preferred that all components of the finished device are incorporated into the security article, this is not essential and in other examples it may be beneficial to provide some of the components in the object to which the security article will ultimately be applied. In one example, the method further comprises applying the security article to or incorporating the security article into an object, preferably a document of value, the object comprising a shielding layer which covers at least the reproduction of the predetermined pattern on at least one side of the security article, the shielding layer being substantially opaque to radiation of the predetermined wavelength. The object may comprise a shielding layer on both sides of the security article covering at least the reproduction of the predetermined pattern, if required.

In another preferred implementation, the method further comprises applying the security article to or incorporating the security article into an object, preferably a document of value, the object comprising a viewing component aligned with at least part of the reproduction of the predetermined pattern, whereby the viewing component and the predetermined pattern in combination exhibit a secure visual effect. As mentioned already, a viewing component is any feature which modifies the appearance of the pattern so that, in combination, a secure visual effect (preferably an optically variable effect) is perceived. Masking grids and focussing elements are examples of viewing components.

In other examples, the substrate web itself may form the basis of one or more object of value, the security device thereby being formed integrally with the object. In this case, the method preferably further comprises cutting the substrate web into individual objects, each object displaying at least one reproduction of the predetermined pattern. For example, the web may be cut into a series of banknotes, each carrying one of the security devices to which the exposed pattern contributes. The substrate web may be printed or coated before or after exposing the vesicular film, the printing or coating defining a window which is at least semi-transparent in the visible spectrum, and the window containing region(s) of the vesicular film which have been or will be exposed, such that at least part of the reproduction of the predetermined pattern is displayed in the window.

The invention also provides an apparatus for manufacturing at least part of a security device, comprising:
  a transport mechanism adapted to convey a substrate web comprising a photosensitive film along a transport path, the photosensitive film being adapted to exhibit an increase in optical density upon exposure to radiation of a predetermined wavelength and concurrent or subsequent heating, the increase in optical density being due to the formation of bubbles within the photosensitive film;
  a mask comprising a predetermined pattern of regions which are substantially opaque to radiation of the predetermined wavelength and at least semi-transparent to radiation of the predetermined wavelength, respectively, the mask being configured to move along at least a portion of the transport path at substantially the same speed as the substrate web;
  a radiation source adapted to emit radiation of the predetermined wavelength through the mask to expose the substrate web; and
  a heater adapted to heat the substrate web comprising the exposed photosensitive film.

The apparatus can be used to perform the method described above, and may be adapted as necessary to incorporate any of the features that have been discussed. Preferably, the apparatus further comprises the substrate web itself.

The invention further provides a security device for an object of value, preferably a document of value, comprising a first photosensitive film exhibiting a first pattern of regions of relatively high and relatively low optical density, respectively, the relatively high optical density regions of the first pattern having bubbles within the photosensitive film arising from exposure of the regions to radiation of a predetermined wavelength to which the first photosensitive film is responsive and subsequent or concurrent heating. As discussed above, patterns formed on vesicular film in this manner can be used in place of a printed pattern to produce many types of secure visual effect, the higher resolution of the pattern significantly improving the achievable visual impact.

In some preferred examples, the regions of relatively high optical density have a surface relief relative to the regions of relatively low optical density. As already discussed, this can be utilised to produce a distinctive visual effect and hence in preferred embodiments, the pattern displayed by the vesicular film comprises a plurality of spaced exposed regions of relatively high optical density, each exposed region having a raised surface relief, configured such that the appearance of the predetermined pattern varies depending on the viewing angle due to the raised regions concealing the intervening spaces to a greater or lesser extent, whereby the predetermined pattern forms a latent device. Advantageously, the distance by which the regions are spaced is substantially equal to the maximum height of the regions.

In other preferred examples (whether or not there is any surface relief), the pattern comprises micro-text or micro-images, or a guilloche or fine line pattern. Features such as these can be produced on a vesicular film at far higher resolution than is achievable with conventional techniques. As a result, the features require higher magnification in order to be revealed and the difficulty of counterfeiting is significantly increased.

Also as discussed above, various secure visual effects can be produced from the combination of two overlying patterns. Therefore, in another preferred embodiment, the security device further comprises a second vesicular film separated from the first vesicular film by one or more layers which are at least semi-transparent in the visible spectrum, the second vesicular film exhibiting a second pattern of regions of relatively high and relatively low optical density, respectively, the relatively high optical density regions of the second pattern having bubbles within the photosensitive film arising from exposure of the regions to radiation of a predetermined wavelength to which the second photosensitive film is responsive and subsequent or concurrent heating, the first and second patterns at least partially overlapping one another. In particularly preferred examples, the first and second patterns in combination form a venetian blind device, a moiré interference device or an animation device, having an appearance which differs at different viewing angles.

Other secure visual effects can be produced using one or more lenses or mirrors to focus or magnify selected portions of the pattern, as discussed above. Hence, in one preferred embodiment, the security device further comprises one or more focussing elements defining a focal plane, the pattern exhibited by the vesicular layer being substantially coincident with the focal plane, whereby a focussed image of at least a portion of the pattern is generated by the focussing element(s). Advantageously, the focussing element(s) and pattern form in combination a lenticular device. In a particularly preferred example, the pattern comprises elements of a first image and elements of a second image arranged such that when the lenticular device is viewed from a first angle, a focussed version of the first image is generated, and when the lenticular device is viewed from a second angle, a focussed version of the second image is generated.

In another advantageous embodiment, the security device further comprises a regular array of micro-focussing elements, the pattern exhibited by the vesicular layer being substantially coincident with the focal plane, and the pattern exhibited by the vesicular film comprising a corresponding array of microimage elements, wherein the pitches of the micro-focusing elements and the array of microimage elements and their relative locations are such that the array of micro-focusing elements cooperates with the array of microimage elements to generate a magnified version of the microimage elements due to the moiré effect, the array of focussing elements and predetermined pattern forming in combination a moiré magnification device.

The invention further provides a security article comprising a security device as described above or a vesicular film exhibiting a pattern for a security device as described above, the security article preferably being a thread, a strip, a foil, a patch, a transfer, a label or an insert.

Also provided is an object of value comprising a security device or a security article each as described above, the object of value preferably being a document of value such as a banknote, a cheque, a passport, a visa, a tax disc, an ID card, a certificate, a stamp, a ticket, a share certificate, a drivers' license, or a certificate of guarantee.

In accordance with another aspect of the invention, a security device is provided comprising a substrate which is substantially visually transparent, the substrate carrying on one side thereof at least a first array of elements arranged to form lines which are laterally spaced from one another, each element having a raised surface profile relative to the surface of the substrate and having a higher optical density than that of the substrate in the spaces between the elements, wherein the lines formed by the elements of the first array are aligned along a first direction whereby the appearance of the device when viewed from either side of the substrate changes at different angles of view, generating a latent effect.

Conventional latent devices generate an optically variable effect which can only be viewed from one side of the device—i.e. that on which the raised elements are disposed. By providing raised profile elements of higher optical density (preferably visually opaque) on a transparent substrate as now proposed, a latent effect can be generated from whichever side the device is viewed, since the regions between the raised elements remain transparent. This enhanced visual impact raises the security level of the device.

Each line can be formed of one continuous elongate element of raised surface profile, or of multiple discontinuous elements (elongate or otherwise). For example, the lines could be "dotted" or "dashed" lines of elements. The lines could be straight (i.e. rectilinear), curved, meandering, zigzagged, sinusoidal or otherwise. Preferably the lines in the first array are substantially parallel to each other (i.e. they are spaced from each other by a substantially constant distance along their length).

Preferably, the one side of the substrate further carries a second array of elements arranged to form lines which are laterally spaced from one another and aligned along a second direction which is substantially perpendicular to the first direction, each element of the second array having a raised surface profile relative to the surface of the substrate and having a higher optical density than that of the substrate in the spaces between the elements, whereby at some angles of view, the area of the device corresponding to the first array appears to have an optical density higher than that corresponding to the second array, and at other angles of view, the area of the device corresponding to the first array appears to have an optical density lower than that corresponding to the second array.

This provides for a particularly strong and easily describable visual effect since the relate brightness of the two areas appears to switch as the device is tilted or rotated to different angles—i.e. there is a "contrast flip" between the two areas.

As mentioned above, the elements are preferably elongate and could take any desirable shape, e.g. rectangular or oval but in preferred embodiments are line elements.

Advantageously, the first array and/or the second array defines one or more graphics. In particularly preferred cases, the first array defines a graphic and the second array defines a background to the graphic. Thus the graphic and its background appear to switch in relative brightness as the device is tilted.

In preferred implementations, the elements are integrally formed with the substrate. For example, this can be achieved where the device is made using the above-described techniques, whereby the elements are exposed regions of a photosensitive film, the photosensitive film being adapted to exhibit an increase in optical density upon exposure to radiation of a predetermined wavelength and concurrent or subsequent heating, the increase in optical density being due to the formation of bubbles within the photosensitive film (i.e. the photosensitive film is a vesicular film). However, other manufacturing techniques could alternatively be used such that no vesicular film is employed. For instance in one example, the elements are (non-integral) print regions, preferably formed by intaglio printing, lithographic printing or screen printing. However this is less preferred since, as described previously, a lower resolution would be achievable. Other options would include forming the relief elements in a transparent material, e.g. by embossing or cast-curing and then applying a coating to render each raised region opaque (or at least of increased optical density). A further alternative is to emboss a light-scattering pattern into a raised transparent region to increase its optical density. However, these techniques are more complex and would increase the manufacturing cost.

Examples of security devices, components thereof, methods for their manufacture and objects of value incorporating such devices will now be described with reference to the accompanying drawings, in which:—

Figure 3:
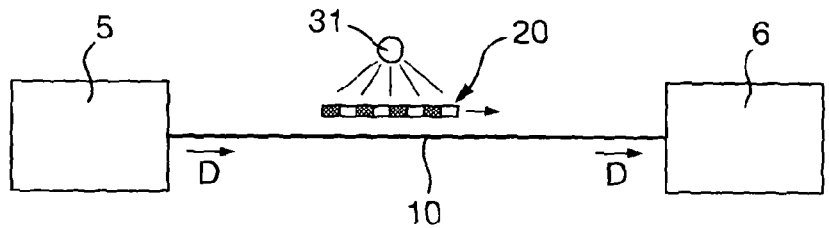
Figure 4:
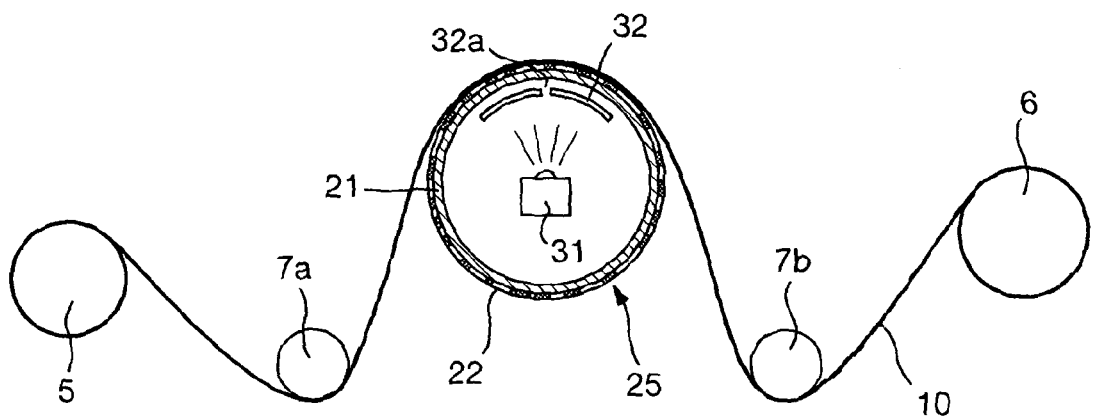
Figure 5:
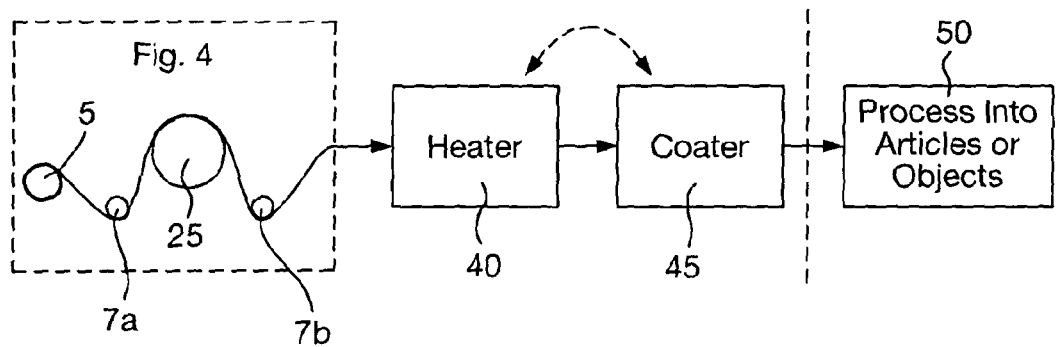
Figure 6A:
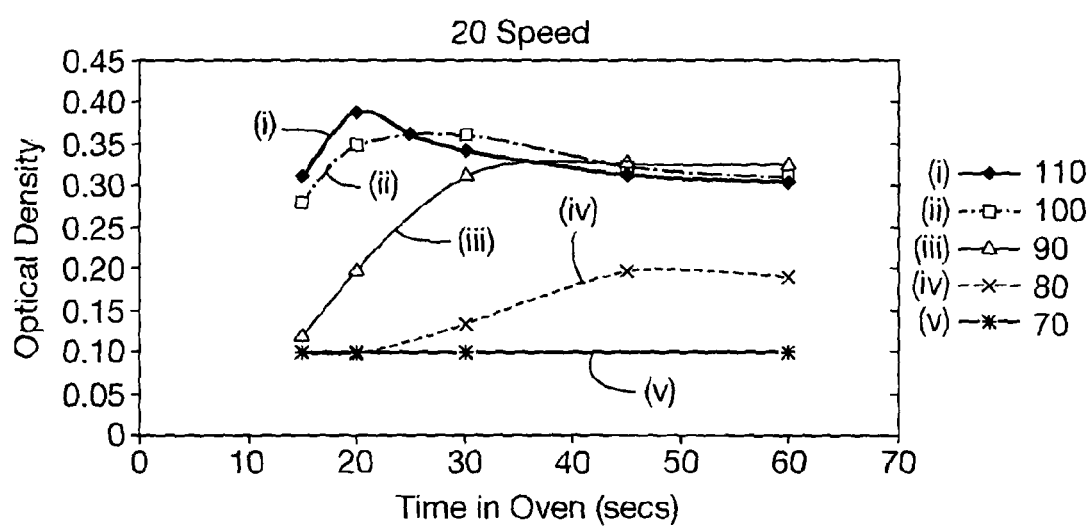
Figure 6B:
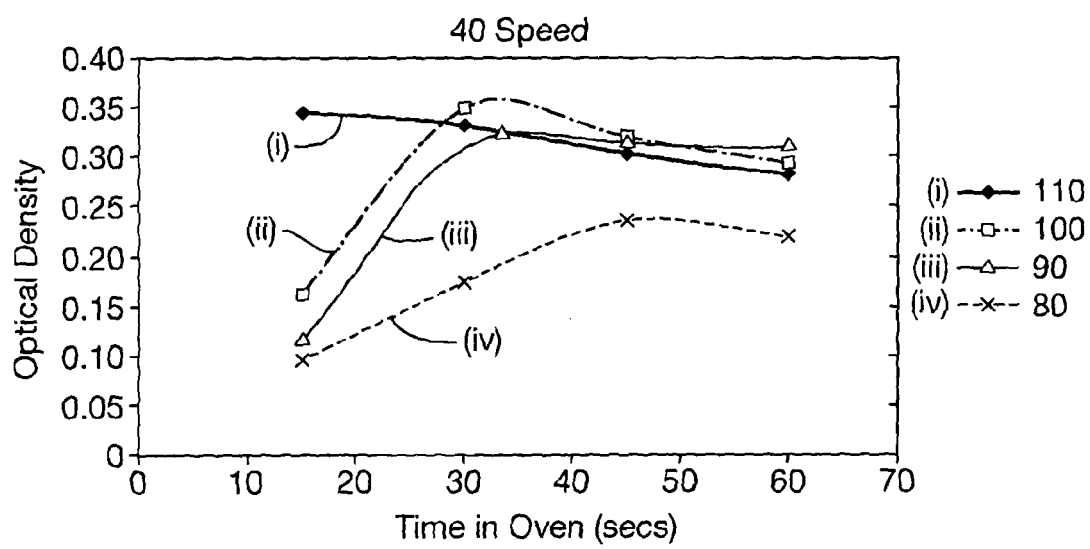
Figure 7A:
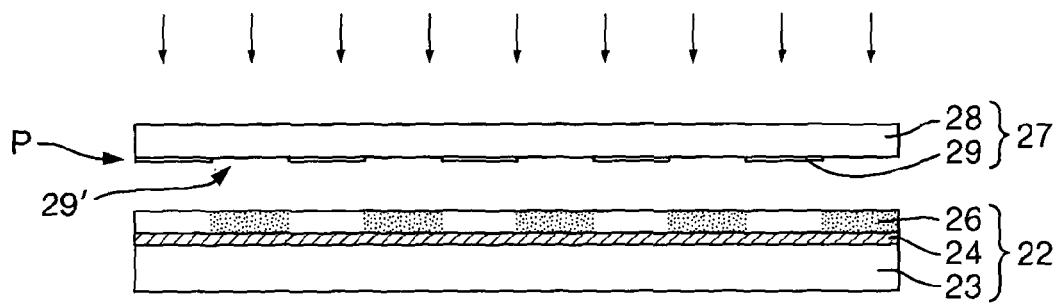
Figure 7B:
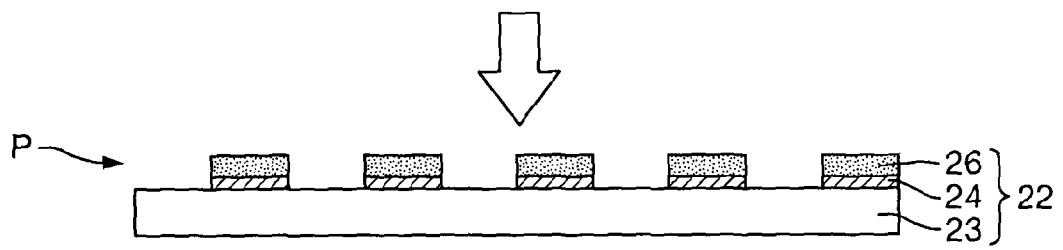
Figure 7C:
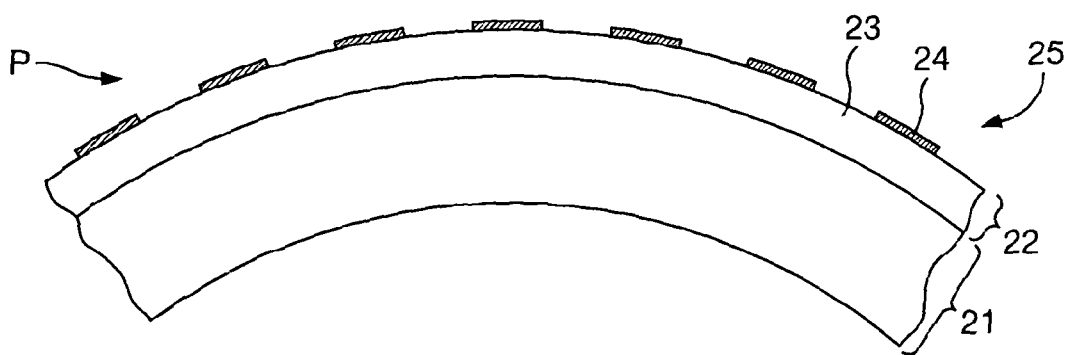
Figure 8A:
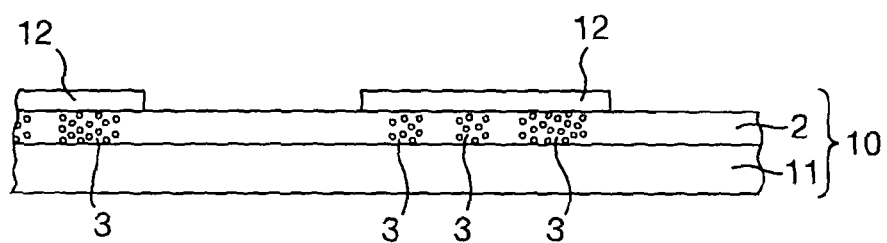
Figure 8B:
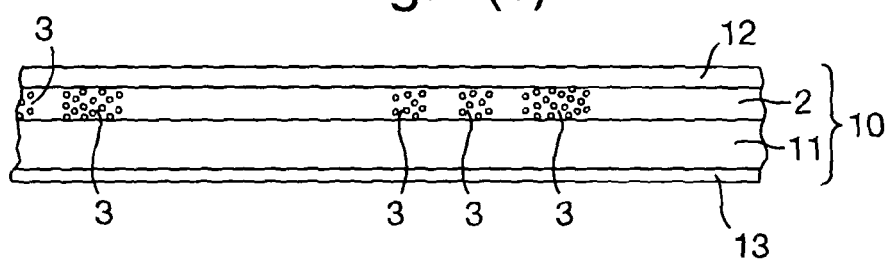
Figure 9A:
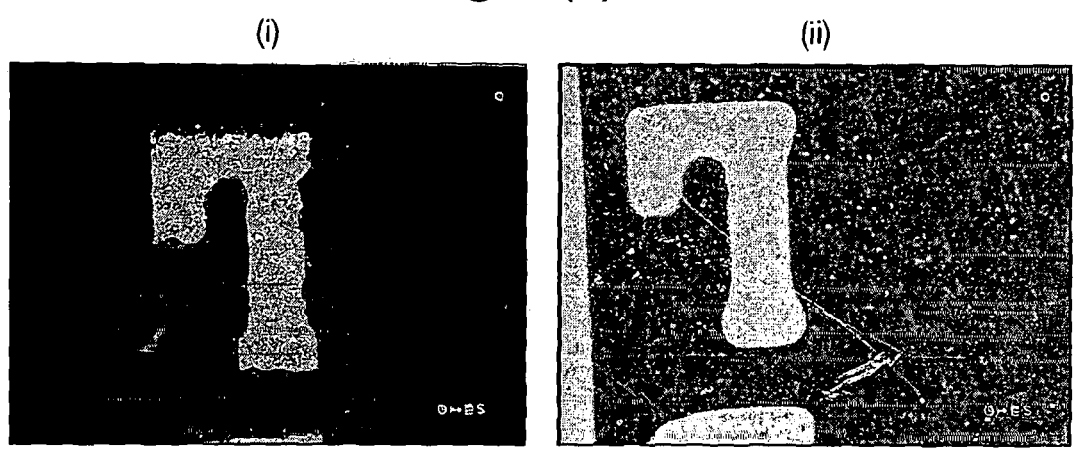
Figure 9B:
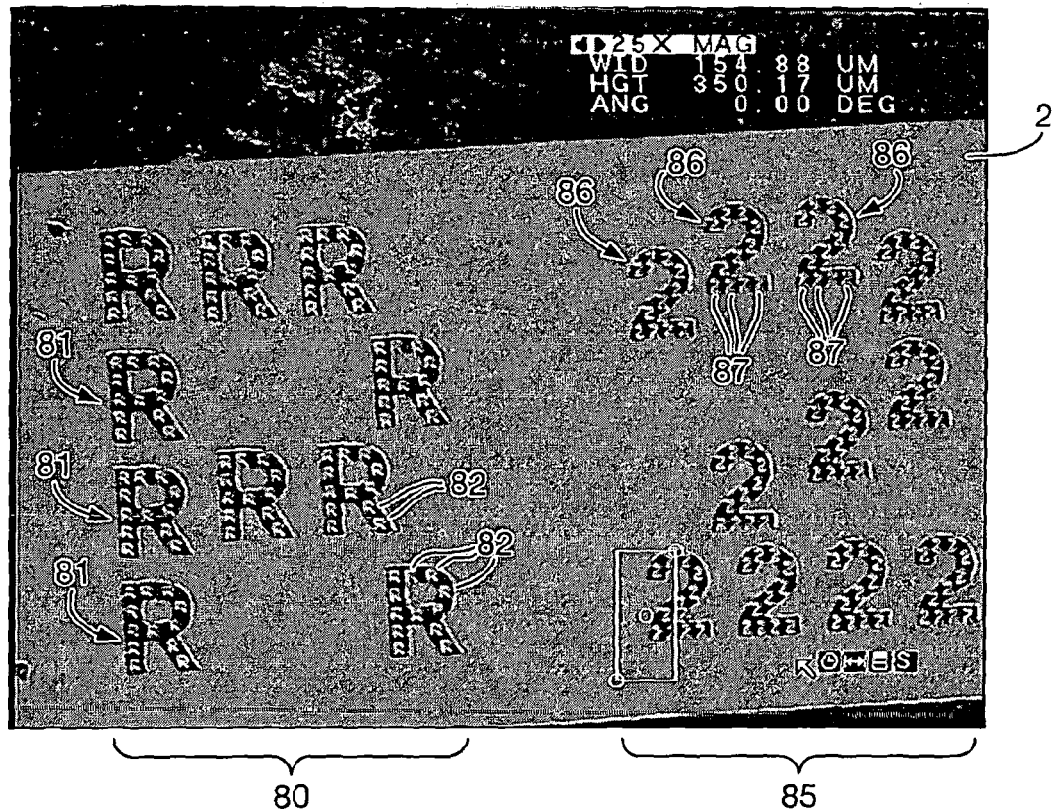
Figure 10:
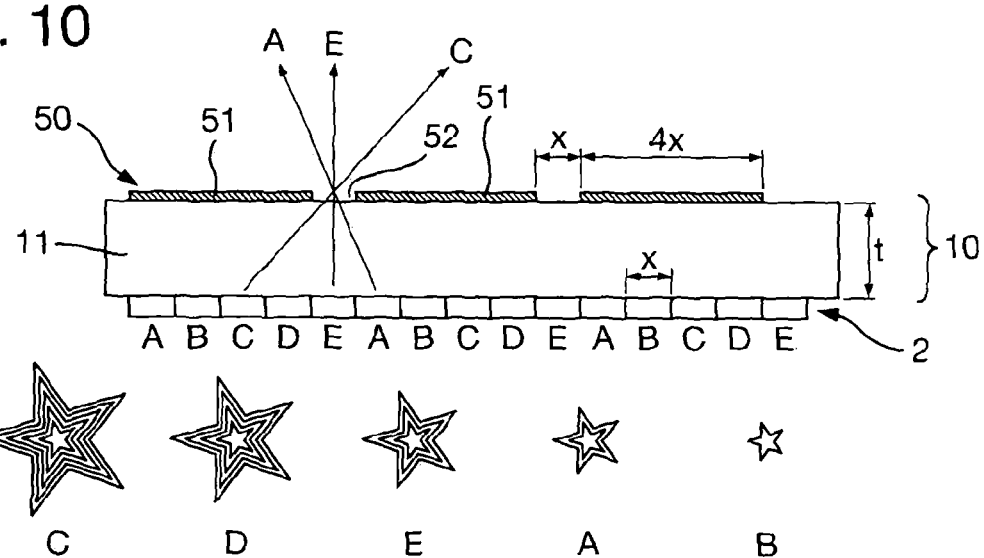
Figure 11:
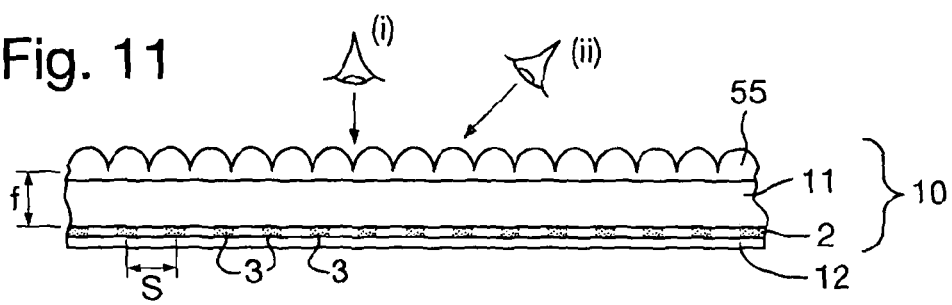
Figure 12A:
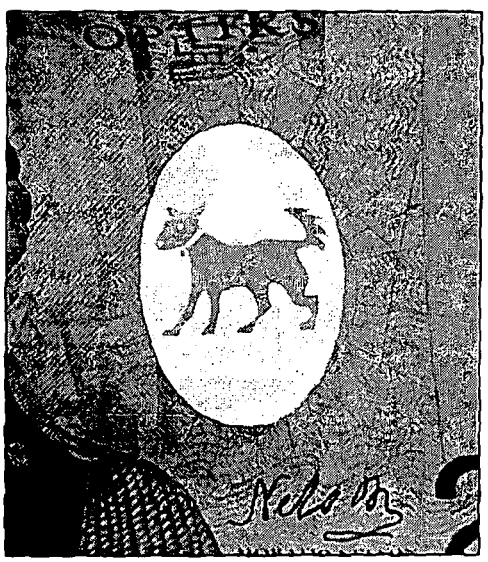
Figure 12B:
Figure 13:
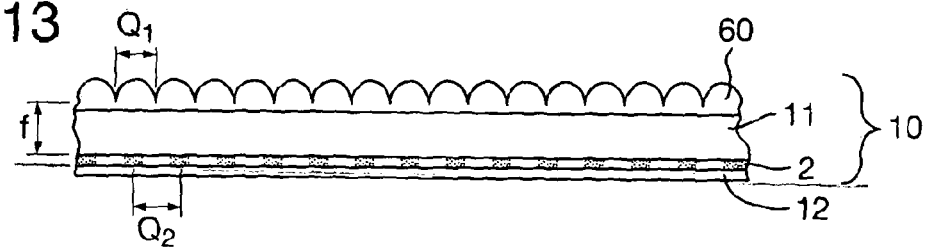
Figure 14A:
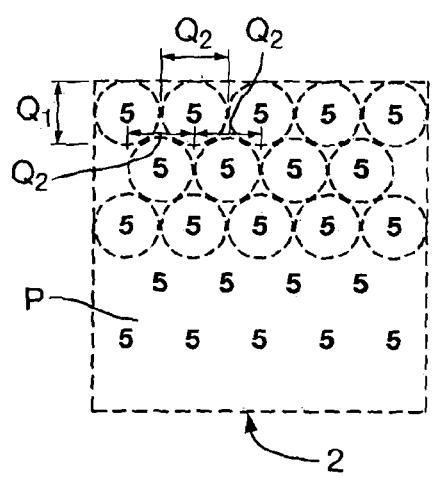
Figure 14B:
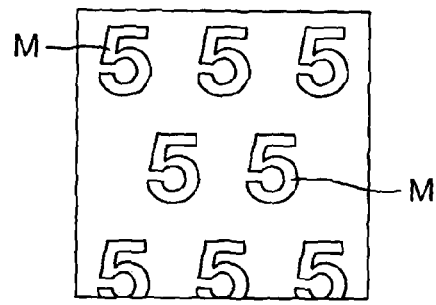
Figure 15:
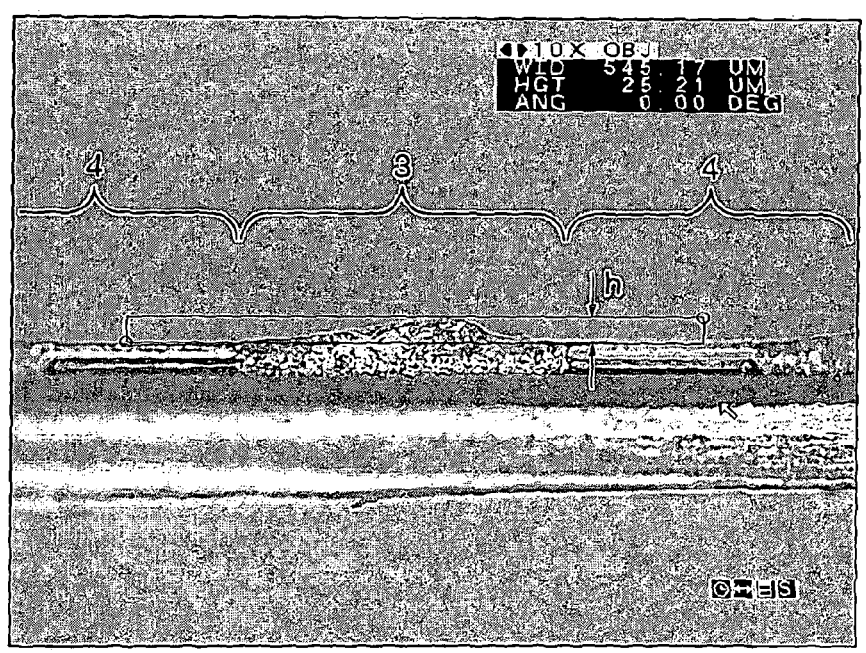
Figure 16A:
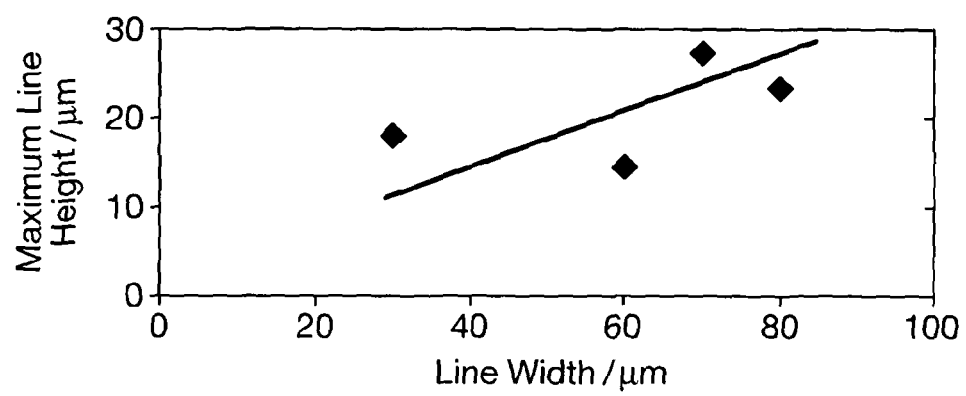
Figure 16B:
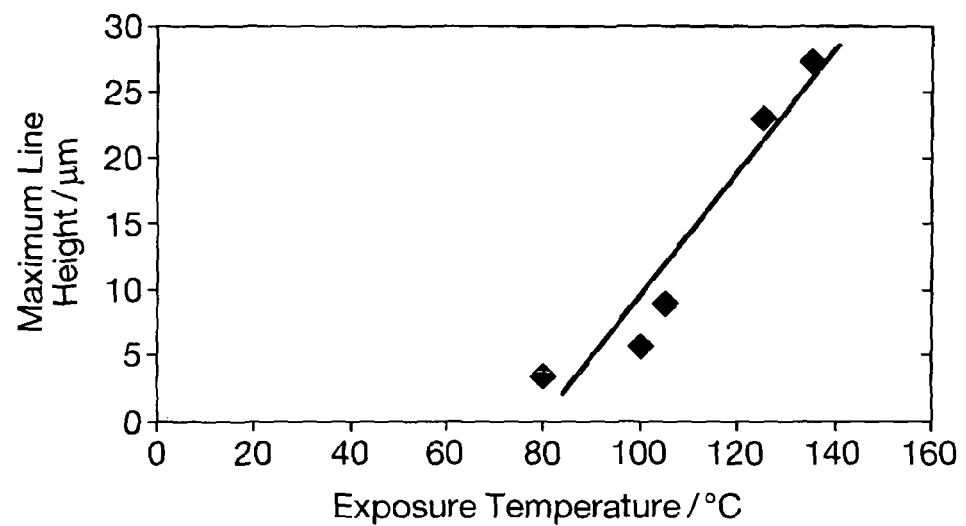
Figure 17:
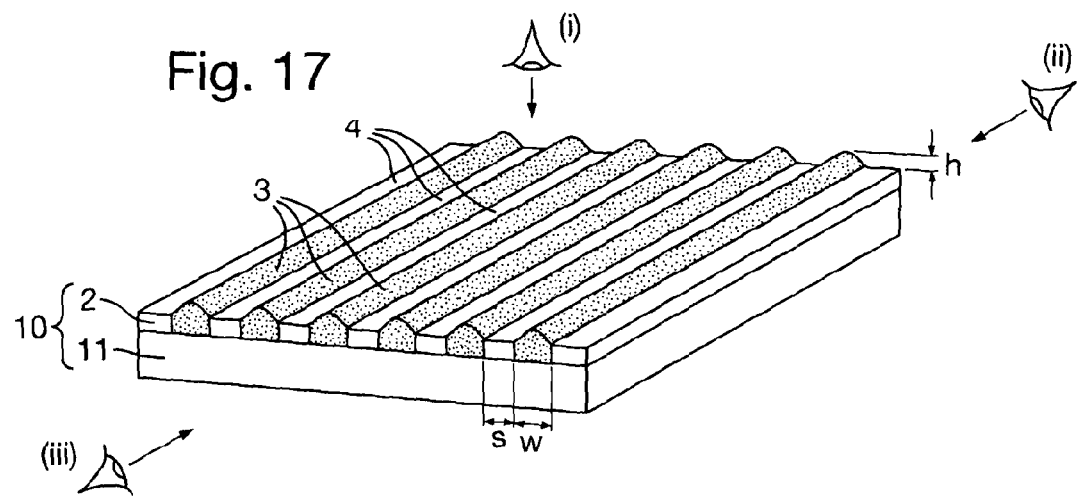
Figure 18A:
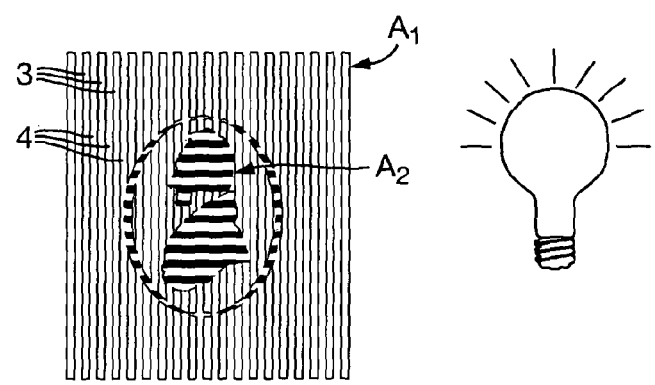
Figure 18B:
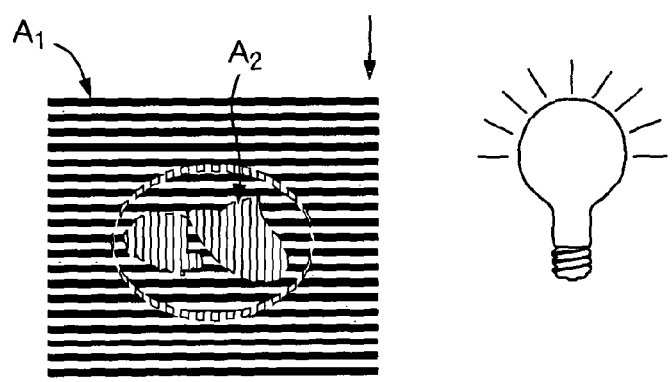
Figure 19A:
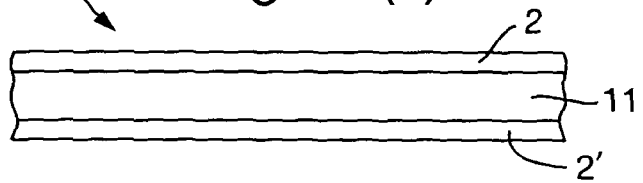
Figure 19B:
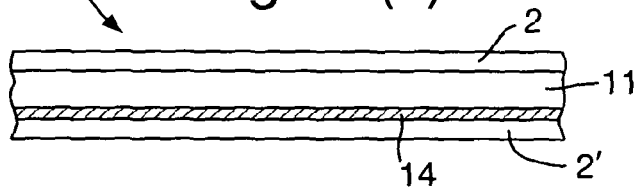
Figure 20A:
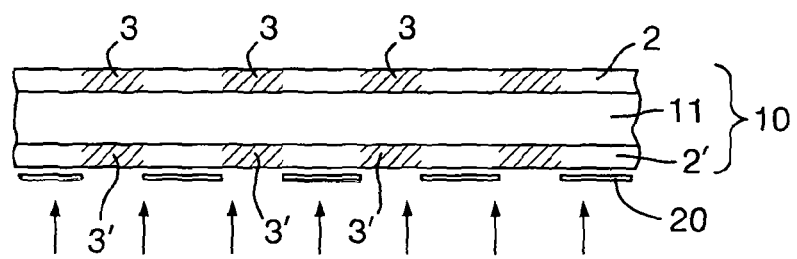
Figure 20B:
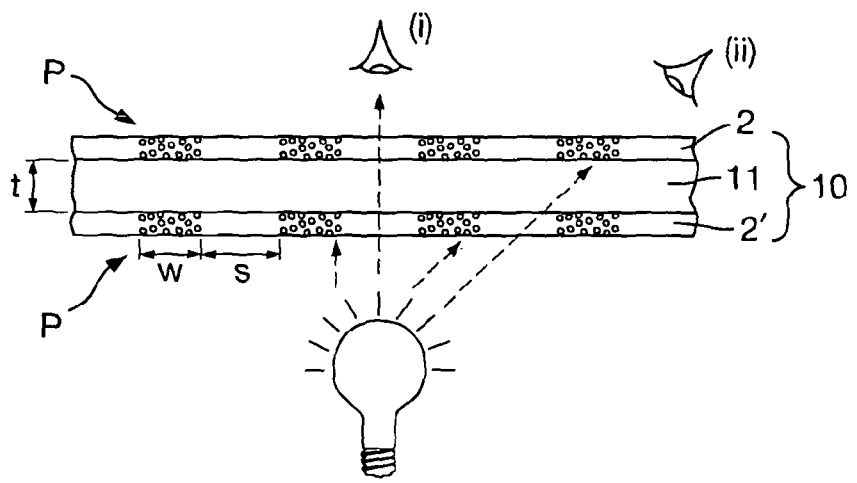
Figure 21:
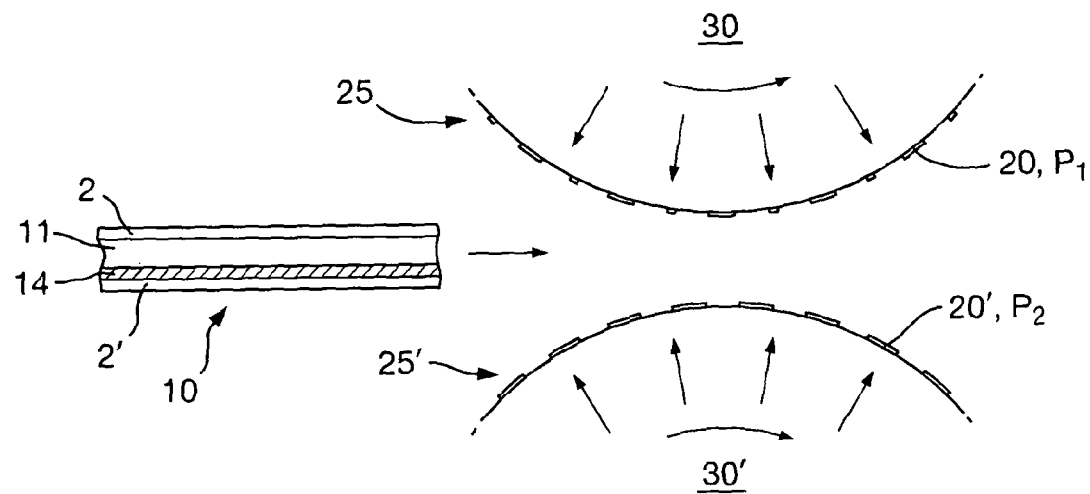
Figure 22:
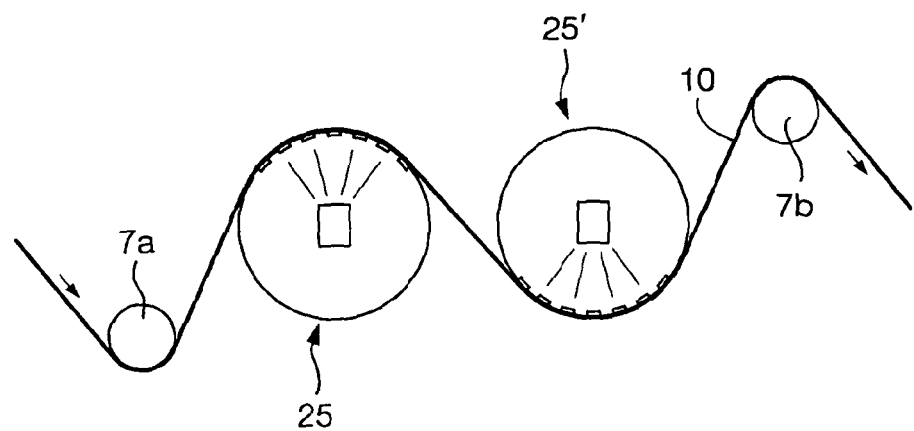
Figure 23:
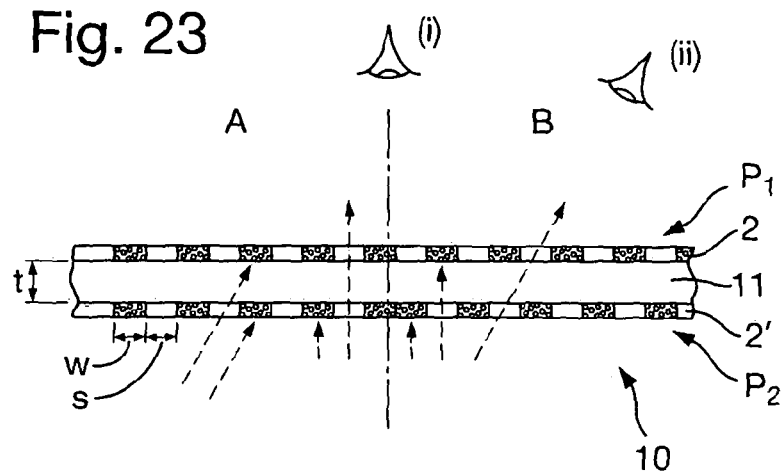
Figure 24A:
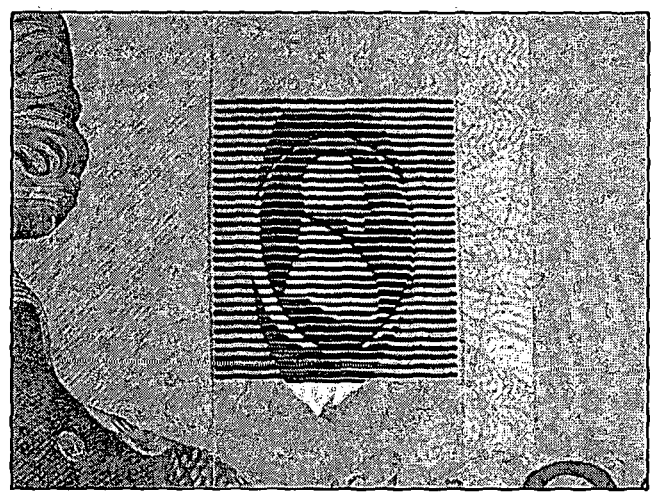
Figure 24B:
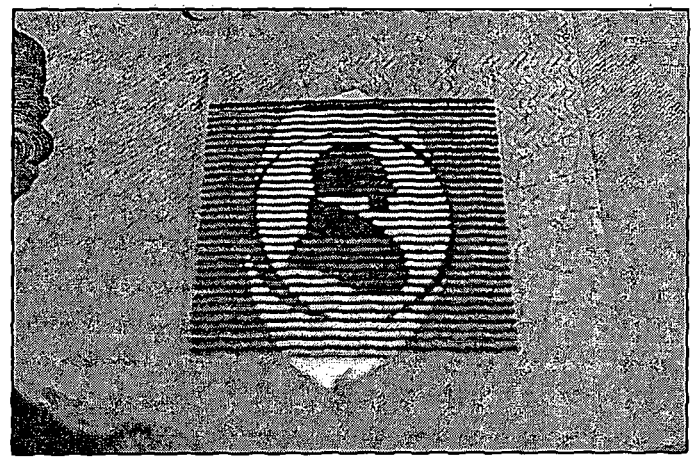
Figure 25:
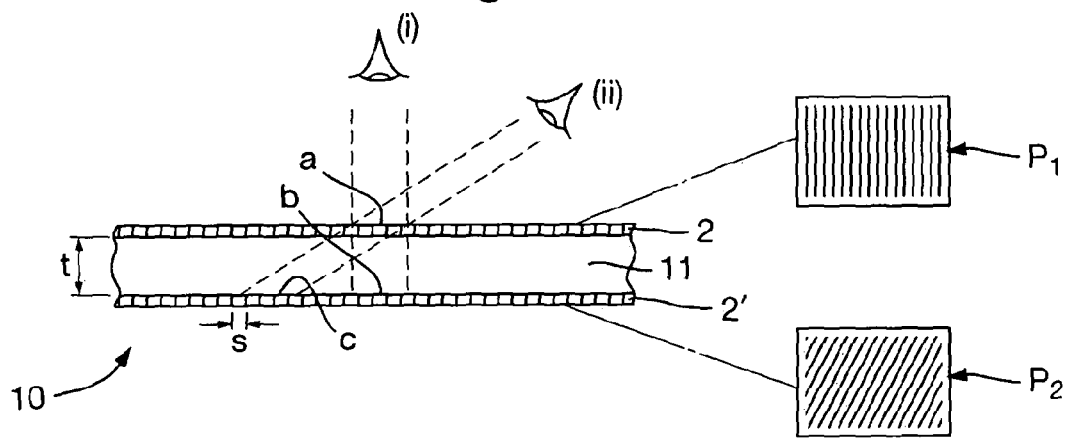
Figure 30A:
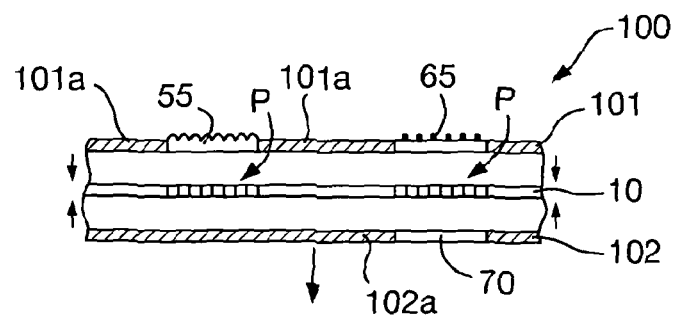
Figure 30B:
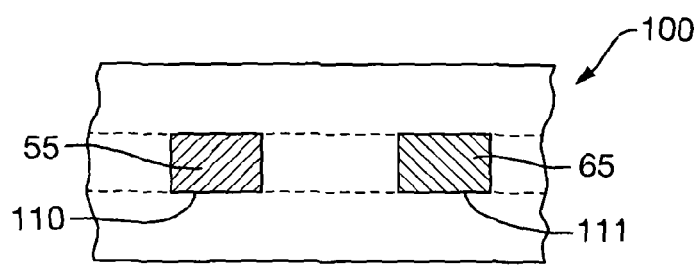
Figure 31A:
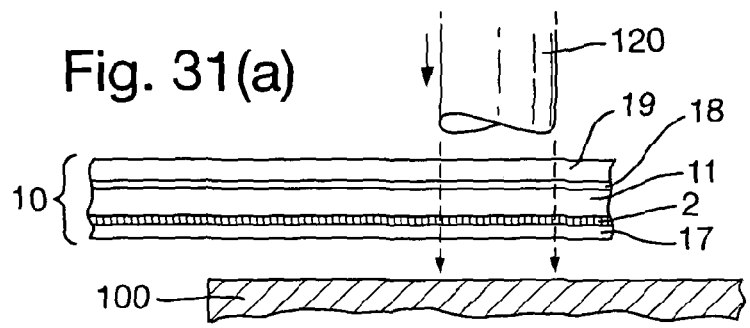
Figure 31B:
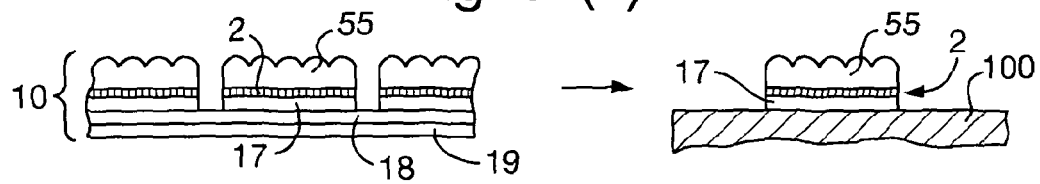
Figure 31C:
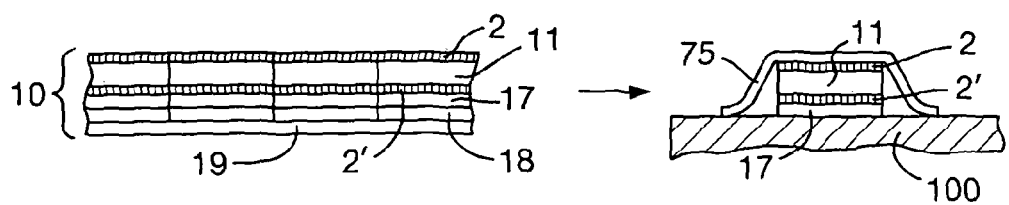

FIG. 3 schematically depicts apparatus used in a first embodiment of a method for manufacturing a security device;

FIG. 4 schematically depicts apparatus used in a second embodiment of a method for manufacturing a security device;

FIG. 5 schematically depicts apparatus used in a third embodiment of a method for manufacturing a security device;

FIGS. 6a and 6b are graphs illustrating optical density levels achieved at different heating temperatures and heating times, for two different radiation exposure intensities;

FIGS. 7a and 7b illustrate steps involved in fabrication of a mask in one embodiment, FIG. 7c depicting the mask forming part of a patterning roller;

FIGS. 8a and 8b show two examples of substrate webs carrying additional shielding layers;

FIG. 9a(i) and (ii) depict a feature formed (i) using gravure printing and (ii) by exposure of a vesicular film, for comparison;

FIG. 9b depicts a first embodiment of a security device;

FIG. 10 depicts a second embodiment of a security device in cross section in FIG. 10(i), FIG. 10(ii) illustrating the appearance of the device at different viewing angles;

FIG. 11 illustrates a cross section through a third embodiment of a security device;

FIGS. 12a and 12b depict an example of a security device of the sort depicted in FIG. 11, from two different viewing angles;

FIG. 13 is a schematic cross section of a fourth embodiment of a security device;

FIG. 14a illustrates an exemplary microimage element pattern as may be used in the embodiment of FIG. 13, FIG. 14b illustrating a magnified version thereof as may be generated by the device;

FIG. 15 is a cross section through a portion of a pattern formed in a vesicular film in one embodiment;

FIG. 16a is a plot illustrating dependence of profile height on feature width and FIG. 16b is a plot illustrating the dependence of profile height on heating temperature;

FIG. 17 illustrates a fifth embodiment of a security device;

FIGS. 18a and 18b show a sixth embodiment of a security device viewed from two different angles;

FIGS. 19a and 19b show two further examples of substrate webs for use in embodiments of the invention, in cross section;

FIG. 20a illustrates the exposing of a substrate web in a further embodiment, FIG. 20b depicting a sixth embodiment of a security device resulting from the exposure step shown in FIG. 20a;

FIG. 21 depicts apparatus used in a third embodiment of a method for manufacturing a security device;

FIG. 22 depicts apparatus used in a fourth embodiment of a method for manufacturing a security device;

FIG. 23 schematically depicts a seventh embodiment of a security device in cross section;

FIGS. 24a and 24b depict an exemplary security device formed using the principles shown in FIG. 23 from two different angles of view;

FIG. 25 depicts a eighth embodiment of a security device, in cross section;

FIG. 26 shows an example of a security device formed based on the principles shown in FIG. 25 at three viewing positions;

FIGS. 27 to 29 depict three embodiments of objects of value each having a security article including a security device, in (a) plan view and (b) cross section;

FIG. 30a is an exploded view of a portion of an object of value in another embodiment incorporating two security devices, FIG. 30b depicting the assembled object of value in plan view;

FIG. 31a depicts a further embodiment of a substrate web formed as a transfer band during application to an object of value, FIG. 31b shows an embodiment of a substrate web formed as a transfer sheet and subsequent cross section once applied to an object of value and FIG. 31c depicts another embodiment of a substrate web formed as a transfer sheet and subsequent cross section once applied to an object of value; and FIGS. 32a, 32b, 32c and 32d depict a further embodiment of a substrate web and processing steps resulting in an embodiment of an object of value incorporating a security device.

The present inventors have found that very high resolution patterns can be produced on vesicular films (i.e. photosensitive films which exhibit an increase in optical density upon exposure to appropriate wavelengths and heating, due to the formation of bubbles in the film) and used in place of conventional printed patterns to form all sorts of security devices. The high resolution and thus small pattern element sizes which can be readily achieved enable a significant improvement in the visual effect exhibited by the device. This gives rise to an increased security level due not only to the enhanced optical impact making the genuine device more instantly recognisable and distinguishable from fakes, but also to the inherent difficulty for a would-be counterfeiter to replicate the device being increased. In many types of device, as will be described below, the high resolution achievable also (or alternatively) permits reduction of the overall device thickness. This not only enables the device to be incorporated into or onto a greater variety of objects, particularly documents of value, than previously possible, but also itself increases the security of the device since counterfeited devices made from commercially available materials will tend to be thick and thus can be easily distinguished from genuine versions.

The technique also lends itself particularly well to the production of security devices which involve one or more transparent components, or are to be incorporated into objects as window devices, since vesicular films can be obtained which are substantially transparent in the visible spectrum until exposure and heating has taking place (as described below). As such, a vesicular film material can typically be incorporated into a structure without altering its appearance (save for any pattern carried by the vesicular film).

Preferred vesicular films typically comprise a polymer matrix containing a photosensitive substance such as a diazo dye which is responsive to one or more particular wavelengths of radiation. It is strongly preferred that the waveband to which the substance is responsive lies outside the visible spectrum or overlaps only a minor region of the visible spectrum, and diazo based vesicular films meet this criterion since the substance responds to ultraviolet/violet radiation in the region between 300 and 460 µm wavelength. One example of a suitable diazo-based vesicular film is the "vesicular microfilm" product available from Exopack Advanced Coatings of Matthews, N.C., USA.

Referring now to FIG. 1, a substrate web 10 comprising a vesicular film 2 is provided. If the vesicular film 2 is sufficiently thick so as to be self-supporting, the substrate web 10 could consist solely of the vesicular film. However, it is generally preferred that the thickness, V, of the vesicular film be kept relatively small for reasons that will be explained below and therefore in the present embodiment a support layer 11 carries the vesicular film 2 thereon. Depending on how the eventual security device is to be viewed, the support layer could be (visibly) opaque, translucent or transparent and may also be opaque or transparent to the radiation to which the vesicular film 2 is responsive. In this example, the vesicular film 2 takes the form of a contiguous layer covering the whole area of the support layer 11. However, this need not be the case and alternative examples will be given below.

Figure 1A:
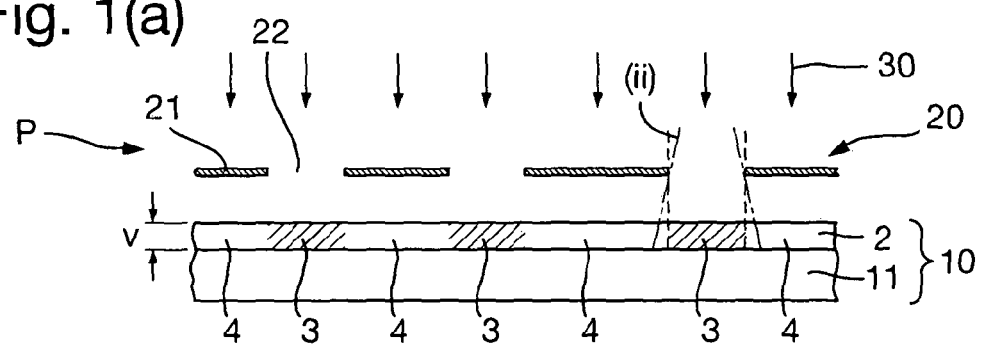
FIG. 1a shows a schematic cross section of an exemplary substrate web during exposure to radiation, FIG. 1b showing the same substrate web after subsequent heating.

FIG. 1*a* shows the substrate web 10 being exposed to radiation 30 through a mask 20. The mask 20 carries a pattern P formed of elements 21 which are substantially opaque to the wavelength of radiation 30 (e.g. UV), and elements 22 which are at least semitransparent to the same wavelength. The exposed regions 3 of the vesicular film 2 reacts to the radiation by releasing gas atoms or molecules within the film structure. In the case of a diazo based film, it will generally be nitrogen gas that is released. In FIG. 1*a*, the regions 3 where this occurs have been shaded, although it will be appreciated that at this stage the regions 3 are not yet visually distinguishable from the neighbouring unexposed regions 4.

Figure 1B:
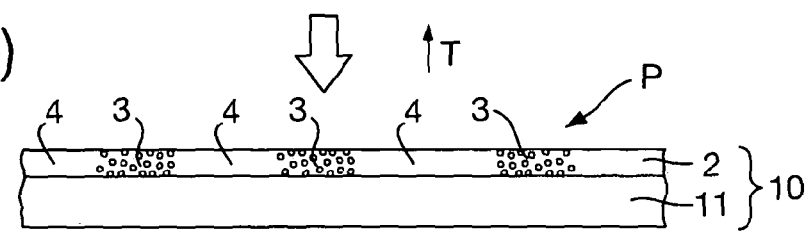

FIG. 1*b* illustrates the same substrate film after heating. Generally, heating will take place after exposure to the radiation (preferably immediately after), but if desired exposure and heating could take place simultaneously. The applied heat enables the released gas molecules to migrate internally within the vesicular film, forming bubbles (vesicles). The bubbles scatter light, causing the local optical density of the vesicular film 2 to increase, whereby the exposed regions 3 appear relatively opaque compared with the unexposed regions 4.

The result is the transfer of a negative version of the pattern P carried by the mask 20 into a visible form displayed by the vesicular film 2. Unlike conventional ink-based printing processes, there is no pattern "spreading" outside the regions of the vesicular film which have been exposed to the radiation and the pattern P carried by the vesicular film is a near identical reproduction of that carried by the mask 20. As such, the resolution of the pattern exhibited by the vesicular film will be substantially the same as that carried by the mask.

The thickness, V, of the vesicular film influences both the resolution of the displayed pattern and its optical density (and hence contrast). Depending on the geometry of the exposure apparatus, the radiation may be fully collimated in which case the width of each exposed region should remain constant throughout the thickness, V, of the vesicular film as illustrated by dashed lines (i) in FIG. 1(*a*). However, in many cases the collimation will not be perfect and this can give rise to "spreading" of the radiation as illustrated by the dashed lines labelled (ii). To minimise the loss of resolution which can result from such spreading, the thickness, V, of the film is preferably kept small such that the radiated area of the film 2 expands by only a small degree between its two surfaces. However, the thinner the film, the fewer bubbles will be formed and hence the lower the increase in optical density upon patterning. As such, a balance between these effects must be found and, in preferred examples, the film 2 has a thickness of around 5 µm. More generally, film thicknesses of between 1 µm and 100 µm, more preferably between 1 µm and 50 µm, still preferably between 1 µm and 20 µm, most preferably between 5 µm and 15 µm might be employed.

Figure 2:
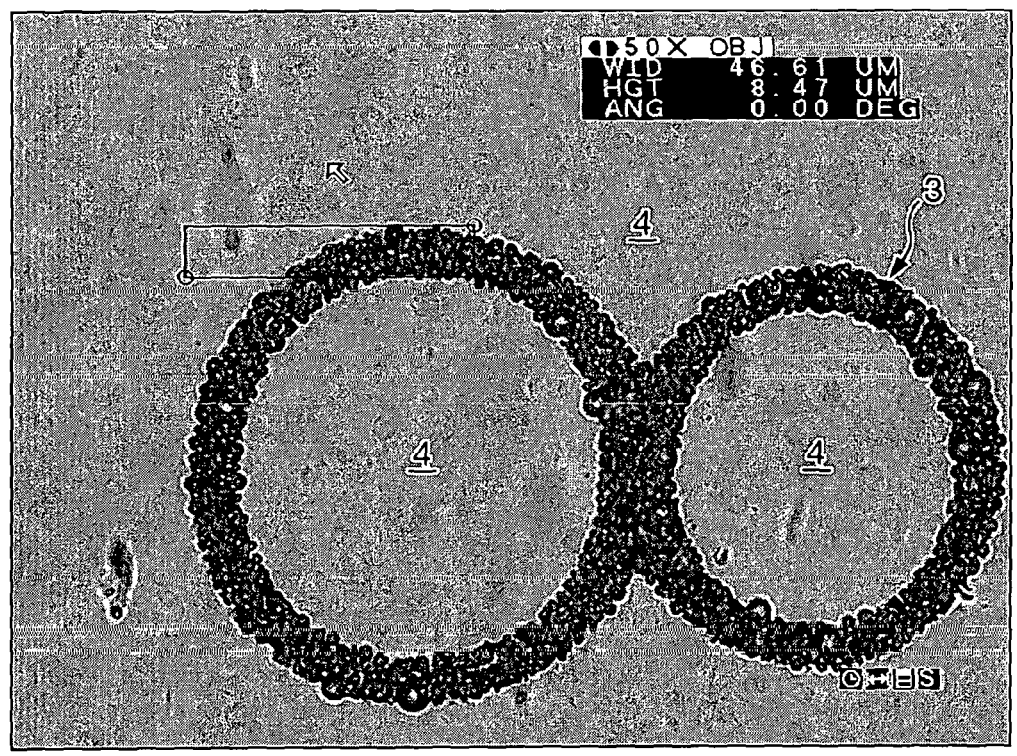
FIG. 2 depicts an exemplary pattern formed in a substrate web.

FIG. 2 is a photograph showing an example of a pattern formed in a vesicular film using the presently disclosed methods at high magnification. It will be seen that the exposed region 3 (here forming the digit "8") is dark, due to the formation of bubbles as already described, whereas the unexposed regions 4 remain relatively light. The bubbles have an average diameter of around 1 µm and, in this example, the line width of the pattern is around 8.5 µm. Generally, in order to take most advantage of the presently disclosed technique, the pattern formed on the vesicular film will include at least one element with a minimum dimension (e.g. line width or dot diameter) that is less than the dimensions achievable in conventional processes. For instance, elements with minimum dimensions of no more than 50 µm, no more than 25 µm, no more than 15 µm, no more than 10 µm or no more than 5 µm are of particular utility.

The use of vesicular film to produce security device components in this way brings with it a number of attendant benefits, including:

High manufacturing speeds—vesicular film patterns can be produced quickly since the required exposure times are short and there are no long development or drying steps involved;

Ease of handling—as compared with conventional printing techniques, handling is considerably simplified since the exposed film can be immediately wound up or otherwise manipulated without risk of damaging the formed pattern;

Dry process—as compared with some other photosensitive materials such as those requiring chemical development, the vesicular materials are tack free, which avoids the mask becoming obscured during use, therefore preserving high resolution results, and further minimises maintenance requirements;

Health and safety—since no chemicals are required to develop the pattern, health and safety risks are reduced; and Optional raised profile features—as described below, it is possible to achieve a raised surface profile of the exposed regions of the vesicular film, which itself can be used to create secure optical effects.

FIG. 3 illustrates a first embodiment of a method for manufacturing components for security devices utilising vesicular films as above described. The method is web-based (e.g. reel to reel) which, unlike a batch-wise technique, permits the production of large numbers of identical devices at high speed. A store 5 of unexposed substrate web 10 comprising vesicular film is provided, typically in the form of a reel. The substrate web is conveyed along a transport path by a transport mechanism (not shown) towards to a second store 6 in which the exposed substrate film 10 is collected. In one example, the transport could be achieved by driving a storage reel onto which the exposed substrate film 10 is collected in store 6, guiding components such as idler rollers being provided as necessary to control the trailing edge of the substrate web 10 as it passes from store 5 to store 6. A mask 20 carrying the pattern to be transferred onto the vesicular film is provided alongside the substrate web 10 and is configured to move along the same transport path at substantially the same speed as the substrate web 10 while exposure is taking place. This could be achieved for example by providing the mask 20 in the form of a plate or belt which is carried alongside the substrate film along the transport path. However, more preferred implementations are described below. A radiation source 31, such as a UV lamp, is provided to emit radiation of the required wavelength through the mask 20. Thus the substrate web can be continuously fed along the transport path and patterned.

FIG. 4 illustrates a particularly preferred apparatus for implementing the method. Here, the mask 20 takes the form of a patterning roller 25 which carries the desired pattern on its circumferential surface. The transport path followed by the substrate web 10 between storage reel 5 and collection reel 6 includes a portion of the patterning roller's circumference, whereby the substrate web is effectively wrapped around the patterning roller 25. During processing, the patterning roller 25 is rotated so that the pattern carried on its surface moves at substantially the same speed as the substrate web 10. This rotation may be driven by the substrate web 10 itself or the patterning roller may be driven by an appropriate motor. The substrate web 10 is exposed to radiation through the mask from the interior of patterning roller 25, which is preferably hollow so as to accommodate a radiation source therewithin, although other arrangements such as a light path made out of reflecting elements contained within the roller are also feasible. Radiation source 31 may comprise, for example, a UV lamp. An optical stop 32 defining an aperture 32a may be used to restrict the illumination region to only a portion of the circumferential surface of the roller. For example, in the present embodiment, a plate 32 carrying a slot-shaped aperture 32a is inserted inside the patterning roller between the support roller and the radiation source 31 such that only an uppermost position of the roller surface is exposed to the radiation at any one time. The width of the slot (in the transport direction) determines, in combination with the transport speed, the duration for which each portion of the substrate web will be exposed to the radiation. A slot width of about 8 mm and transport speed of around 15 meters per minute, corresponding to an exposure time of approximately 0.03 s for each position along the length of the web, has been found to produce good results but this can of course be altered to adjust the exposure dosage.

To further urge the substrate web 10 against the patterning roller 25 during exposure, one or more tensioning rollers 7a and 7b may be provided as shown. This also assists in preventing any slippage between the patterning roller and the web 10.

After exposure, the substrate web 10 may be collected on reel 6 before subsequent processing takes place: for instance, the collection reel 6 carrying the exposed web could be placed in its entirety into a separate heater to develop the exposed pattern. Preferably, any delay between exposure and heating of each part of the web is no more than 2 hours, more preferably less than 1 hour, still preferably less than 10 minutes and most preferably less than 1 minute (the timings given are for each location on the web, between the end of exposure and beginning of heating). However, in-line processes are generally preferred such as that illustrated in the embodiment of FIG. 5 whereby, after passing the patterning roller 25, the exposed substrate web 10 continues through a heater 40 in which development of the pattern takes place. This allows for substantially immediate heating following exposure. The in-line process may also include one or more additional stations such as a coater 45 for applying additional layers to the substrate web as will be discussed below. Heating and coating could take place in either order since it is not essential for the heating to take place immediately after exposure. The completed, exposed substrate web 10 can then be processed into security articles or directly into objects of value using numerous different techniques, represented by block 50. Examples will be given below.

The degree of optical density exhibited by the exposed regions of vesicular film 2 depends on parameters including the intensity of the exposure radiation, the duration of exposure, the temperature to which the vesicular film is heated and the duration of heating. FIGS. 6a and 6b are plots illustrating empirical results showing optical density of the exposed regions of vesicular film at different parameter settings. The vesicular film used in these experiments was the aforementioned diazo-based film available from Exopack Advanced Coatings of Matthews, N.C., USA having an unexposed film thickness of about 5 µm. FIG. 6a shows the dependence of optical density on heating time for five different oven temperatures: 110° C., 100° C., 90° C., 80° C. and 70° C. In each case, the radiation source was set to a dial setting of 20 which, using the above described apparatus and a transport speed of 15 meters per minute (and hence an exposure time of around 0.03 s for each position along the length of the web) tests showed corresponds to delivering approximately 50 mJ of radiation energy to each position along the length of the substrate web. It will be seen that the greatest increase in optical density is achieved by the application of relatively high temperatures (100 to 110° C.) in relatively short periods of time (20 to 30 seconds). If the heating takes place at too high a temperature or for too long, the optical density peaks and then declines, and it is believed this is due to a reduction in light scattering when the individual bubbles exceed a certain diameter. FIG. 6b plots the same variables for four different oven temperatures (110° C., 100° C., 90° C. and 80° C.) after exposure to a lower radiation exposure dosage of approximately 25 mJ for each position along the length of the web (achieved here by reducing the power of the radiation source and maintaining the same exposure time as before). In this case it will be seen that the maximum achievable optical density is slightly reduced and is achieved by heating the vesicular film to slightly lower temperatures (around 100° C.) for slightly longer duration (30 to 40 seconds).

In practice, the most appropriate exposure and heating settings will need to be determined based on the desired optical effect to be achieved and the required process speed.

The patterning roller 25 can be constructed in a number of ways. In the example shown in FIG. 4, the patterning roller 25 comprises a support roller 21 and a masking sheet 22. The support roller 21 is at least semi-transparent (preferably substantially transparent) to the radiation used to expose the vesicular film. For example, the support roller 21 may comprise a hollow glass or quartz cylinder, suitable examples of which are available from GEVV (EC) Limited of Crawley, United Kingdom. Both glass and quartz are substantially transparent to UV radiation. The masking sheet 22 can be carried on the exterior or interior surface of the cylinder and comprises regions which are substantially opaque to the radiation as well as regions which are at least semi-transparent to the radiation, thereby defining the pattern to be transferred to the vesicular film. Conveniently, the masking sheet 22 is separable from the support roller so that the same apparatus can be used to achieve different patterns on the vesicular film simply by replacing the masking sheet as appropriate. However, in alternative embodiments, opaque pattern elements could be incorporated into the surface or interior of the support roller 21 in place of masking sheet 22. For example, the surface of the cylinder can be permanently metallised and etched to form a desired pattern.

FIG. 7 illustrates a preferred batch-wise technique for manufacturing a masking sheet 22 as used in the FIG. 4 embodiment. FIG. 7a shows a cross-section through a structure used to form the masking sheet 22, comprising a carrier layer 23 which is substantially transparent to the radiation and a masking layer 24 which is substantially opaque to the radiation. For example, carrier layer 23 may be formed of a polymer such as PET or BOPP, both of which transmit UV light (although BOPP is preferred since it is more transparent to UV than PET). The masking layer 24 is typically formed of a metallic layer deposited on the carrier, such as aluminium. Overlying the structure is a layer of photoresist 26. A master plate 27 carrying the desired pattern P is used to photopattern the masking sheet 22. Typically, the master plate 27 will comprise a glass or quartz plate 28 which is transparent to the appropriate radiation wavelength and an opaque pattern layer 29 including gaps 29' through which the radiation can pass. The patterning of layer 29 is typically carried out by laser etching in order to produce the desired high resolution pattern P. The master plate 27 is placed against masking layer 22 and exposed to radiation which cures the photoresist 26 only in the regions of gaps 29'. A chemical etch is then performed and the result is shown in FIG. 7b which shows that the regions of unexposed photoresist 26, and the masking material 24 underlying those regions, has been removed.

The remaining photoresist 26 can then be removed and the resulting masking sheet 22, comprising transparent carrier 23 and opaque pattern regions 24 can be fitted to the support roller 21 as shown in FIG. 7c. To enable the masking sheet 22 to be wrapped around the roller and conform to its surface, the carrier layer 23 is preferably flexible (still preferably resilient), and both PET and BOPP have been found to have suitable mechanical characteristics for this purpose.

In alternative embodiments, the carrier layer 23 could be omitted entirely, the masking sheet being formed for example from a metal layer including appropriate cutouts which itself can be conformed to the support roller. However, this is less preferred since the thickness of the metal layer required to maintain its integrity gives rise to an increased surface profile which could damage the substrate web 10 in use. In further alternative embodiments, the masking sheet need not be flexible since it could be formed for instance as a cylinder which can be slid onto or into the support roller 21.

If the radiation to which the vesicular film is responsive is in common use or forms part of ambient light, such as UV wavelengths, it is highly advantageous to protect the patterned vesicular film 2 in the final product through the use of one or more shielding elements which block the passage of the relevant wavelength(s). Without shielding, the pattern formed in the vesicular film could be damaged or obliterated if the film is again exposed to the relevant wavelength and then heated. As will be discussed further below, shielding can be achieved without modification of the substrate web 10 if the object of value which will ultimately carry the security device itself includes suitable shielding materials. However, in many cases it is preferable that at least some of the shielding is performed by the substrate web 10 itself. In a first example, the substrate web 10 could have the structure already depicted in FIG. 1, the support layer 11 being formed of a material which is substantially opaque to the wavelength of radiation to which the vesicular film 2 is responsive. This will shield the vesicular film 2 from one side and this will be sufficient for example if the vesicular film 2 is ultimately sandwiched between the support layer 11 and some opaque portion of the object of value to which the device is ultimately applied.

In other examples, additional components may be applied to the substrate web in order to perform the shielding. FIGS. 8a and 8b show two examples of substrate webs 10 which comprise such shielding components. In FIG. 8a, the unexposed substrate web 10 originally had the same structure as that depicted in FIG. 1, consisting of a support layer 11 (which may be transparent or opaque to the relevant wavelength), and vesicular film 2. After exposure to the radiation through mask 20, a shielding layer 12 has been applied to the substrate web. The shielding layer 12 could comprise for example a UV-opaque polymer lacquer such as a resin binder containing UV absorbers e.g. $TiO_2$ or Tinuvin 326™ or Tinuvin P™ by BASF plc. In the example shown, the shielding layer 12 is formed on the surface of the vesicular film 2 only in the vicinity of the exposed regions 3. If the support layer 11 is also opaque to the relevant wavelength of radiation, this will be sufficient to shield the pattern exhibited by the exposed vesicular film from both sides and thereby preserve the desired secure visual effect. The regions of the vesicular film 2 uncovered by layer 12 may ultimately be shielded by some structure in the object of value to which the substrate web is applied or could be left unshielded, for example, if the sections are concealed by printing or otherwise such that their appearance is not of significance.

FIG. 8b shows another example in which two shielding layers 12 and 13 have been applied, one to each side of the exposed substrate web. In this case, each of the shielding layers 12 and 13 is contiguous, covering substantially the whole area of the substrate web 10 such that all regions of the vesicular film 2 are protected. This configuration is most preferred since the coated substrate web can then be handled without risk of any unintended exposure. Again, the shielding layers 12 and 13 can be formed of a suitable lacquer opaque to the wavelength radiation in question.

In the case of the FIG. 8b example, one or other of the shielding layers 12 and 13 could be provided as part of the substrate web 10 before patterning of the vesicular film 2. The second shielding layer will of course need to be applied after exposure has taken place. Such layers applied after exposure (e.g. layers 12 in each of FIGS. 8a and 8b) could be applied before or after heating has taken place to develop the exposed pattern.

The shielding layers could be applied for example by means of coating, printing, laminating or extruding suitable material on to the surface(s) of the substrate web 10, or by conveying the substrate web 10 through a bath of the protective coating.

It will also be appreciated that one or more of the shielding layers 12, 13 may be multifunctional, for example also providing structural support to the substrate web (e.g. support layer 11) and/or forming a viewing component which contributes to the secure visual effect ultimately exhibited by the device, such as a lenticular array. Examples will be given below.

As an alternative to the provision of a shielding layer, the device can be protected from damage caused by subsequent UV exposure and heating by performing additional processing steps to deactivate the film after the desired pattern has been formed. Hence in a further embodiment, after the pattern has been developed, the photosensitive film is exposed to radiation of the predetermined wavelength for a second time, for example by providing a second irradiation station in the processing line. Preferably this exposure takes place without any mask such that the whole width of the web is exposed although previously exposed part of the web and/or portions of the web which will not be visible in the final device could be excluded.

The re-exposure causes gas to be released within the film in the manner previously described outside the desired pattern regions. To prevent the released gas forming bubbles and becoming visible, the film is then maintained below temperatures at which the released gas is able to migrate for a sufficient period of time after which elevation to higher temperatures does not cause the formation of bubbles. During this period the released gas leaches out of the film without forming significant bubbles. Following this, subsequent exposure and/or heating will have no or negligible effect on the film, thereby effectively fixing the predetermined pattern and preventing alteration.

As described above, the temperatures which are required for formation of bubbles depend on the film chemistry and similarly the maximum temperature at which the film should be maintained after the second exposure will also depend on the type of film in use. For the films described above, preferably the film is kept at temperatures below 70 degrees C. for at least two hours immediately following exposure. For example, the twice-exposed film may be stored overnight (e.g. 8 hours) at room temperature (e.g. 10 to 25 degrees C.).

Of course, the above deactivating steps can be used in combination with a UV-shielding layer if preferred, in which case the shielding layer will typically be applied after the second exposure step and during or after the leaching period.

The above-described techniques can be used to form any type of security device which incorporates a visible pattern and, compared with conventional devices in which the pattern is provided by way of printing, the quality and resolution can be significantly improved. For comparison, FIG. 9a(i) shows a conventional printed letter "L" (upsidedown) and FIG. 9a(ii) shows a comparable feature of the same size formed using the present disclosed techniques. Both devices have approximately the same dimensions but under the high magnification utilised in the Figures, it will be seen that the print definition of the vesicular film-based device shown in FIG. 9a(ii) is far superior to that of the printed device shown in FIG. 9a(i). In particular, in the vesicular film-based device, the edges of the letter "L" are smooth and sharp, wherein those of the printed device are ill-defined, causing the line thickness and ultimately the shape of the character to vary in an uncontrolled manner.

Some examples of security devices incorporating a pattern formed on vesicular film will now be described.

FIG. 9b depicts two microtext security devices 80 and 85, here representing the letter "R" and the number "2", respectively, formed by patterning a vesicular film 2 in the above-described manner. The significantly enhanced print definition achieved with the vesicular film-based device enables microtext type devices to be formed at much smaller scales than previously possible and still be clearly resolved when observed under high magnification. More complex microtext designs are also made possible and in the present example, each of the devices 80, 85 comprises an array of first-level microtext elements 81, 86 positioned so as to form the macro-sized element 80, 85 which can be observed without the need for magnification. Thus, the first device comprises ten first-level microtext letters "R" (items 81) which together form a macro-scale letter "R", and the second device comprises 11 first-level microtext numbers "2" (items 86) arranged to form a macro-scale number "2". The first-level microtext elements 81, 86 have a line width of around 50 μm which is achievable using conventional printing techniques (to a lesser degree of quality). However, in the present example, each first-level microtext element 81, 86 is itself made up of an array of second-level microtext elements 82, 87, each first-level microtext letter "R" being made up of 12 second-level microtext letters "R" (items 82) and each first-level microtext number "2" containing 11 second-level microtext numbers "2" (items 87). The second-level microtext elements 82, 87 have a line width of around 20 μm. It has not previously been possible to form text containing more than one level of microtext in this way. This feature therefore provides a higher level of security than conventional microtext devices since the presence of the second-level elements (which will be detectable under magnification) will clearly distinguish a genuine device over a counterfeit version.

FIG. 10 depicts a second embodiment of a security device, this time comprising a vesicular film in combination with a viewing component in the form of a masking grid 50. FIG. 10(i) shows a cross-section through the device and, in this case, all of the device components form part of the substrate web 10. However, this need not be the case since the masking grid 50 could form part of an object of value to which the substrate web 10 (comprising only vesicular film 2 carried on a visually transparent support layer 11) is attached. One or more shielding layers for protecting the vesicular film 2 from radiation to which it is responsive would preferably also be provided but these are not shown in FIG. 10(i) for clarity.

The pattern displayed by exposed vesicular film 2 comprises a sequence of image components, labelled A, B, C, etc. FIG. 10(ii) shows each of the complete images A, B, C, etc from which the image elements are taken and it will be seen that these comprise a sequence of animation steps depicting star symbol changing in size. To create the pattern formed on vesicular film 2, the five images A to E are split into elements or "slices" and interleaved with one another so that a slice of image A is positioned next to a slice of image B, which in turn is positioned next to a slice of image C, and so fourth. The resulting pattern is formed on a mask and transferred to vesicular film 2 on substrate web 10 in the manner described above. On the opposite side of transparent support layer 11, a masking grid 50 is provided which comprises a spaced array of visually opaque lines 51 with intervening transparent portions 52 through which the pattern on vesicular film 2 may be viewed. The masking grid 50 could be a pattern formed in a second vesicular film (as will be described in more detail in later embodiments) or can take the form of a conventional print or metallisation which may be applied to the support layer 11 before or after exposure of the vesicular film 2 takes place.

The device could be designed to be viewed in reflected or transmitted light. Transmitted light is preferred since the contrast in the image can generally be perceived more clearly and in addition the same visual effect can be viewed from both sides of the device. When the device is viewed from above the masking grid 50, at any one instant, the image slices from only one of the images A to E are visible. For example, in the configuration shown in FIG. 10(i), when the device is viewed straight-on, only the image slices forming image E will be visible, and thus the device as a whole will appear to exhibit a complete reproduction of image E. Provided the dimensions of the device are correctly selected, when the device is observed from different angles, different images will become visible. For example, as shown in FIG. 10(i), when the device is viewed from position A, only the image slices forming image A will be visible through the masking grid 50, the device as a whole whereby exhibiting the complete image A. Similarly, when the device is viewed from position C depicted in FIG. 10(i), only the image slices forming image C will be visible. As such, as the device is tilted and the viewer observes it at different angles, different stages of the animation will be seen and, provided the images are printed in the correct sequence, an animation will be perceived. In the present example this will appear as a star symbol increasing or decreasing as the device is tilted. Thus, in this case the animation is perceived as a zooming in and out but in other cases the images could be arranged to depict, for example, perceived motion (e.g. a horse galloping), morphing (e.g. a sun changing into a moon) or perceived 3D depth (by providing multiple images of the same object, but from slightly different angles). Of course, in other examples, fewer images (e.g. 2) could be interleaved resulting in a "switch" from one image to another at certain tilt angles, rather than an animation effect.

In order to achieve this effect, the width of each image slice, X, must be smaller than the thickness, t, of the transparent support layer 11, preferably several times smaller, such that there is a high aspect ratio of the thickness t to image slice width X. This is necessary in order that a sufficient portion of the pattern on vesicular layer 2 can be revealed through tilting of the device. If the aspect ratio were too low, it would be necessary to tilt the device to very high angles before any change in image will be perceived. In a preferred example, each image slice has a width X of the order of 5 to 10 μm, and the thickness t of the support layer 11 is approximately 25 to 35 μm. The use of a vesicular film to form the pattern is therefore particularly advantageous since the high resolution nature of the process allows the formation of image elements at these small dimensions.

The dimensions of the masking grid are generally larger than those of the pattern elements, requiring opaque stripes 51 of width ((n−1)X) where n is the number of images to be revealed (here, five), spaced by transparent regions 52 of approximately the same width as that of the image slices (X). Thus, in this example the opaque regions 51 of the masking grid 50 have a width of around 20 to 40 μm and hence can be produced using conventional techniques such as printing or de-metallisation of vapour deposited metallic layers. However, as discussed below the masking grid elements could be alternatively be formed in a second vesicular film.

FIG. 11 shows a third embodiment of a security device incorporating a vesicular film, in cross-section. Here, the device is a lenticular device and comprises a viewing component in the form of microlens array 55, e.g. an array of cylindrical lenses formed for example in a separate cast-cure process. As in the previous embodiment, the lens array 55 here forms part of the substrate web 10 although in other cases could form part of an object of value to which the exposed substrate web 10 is later applied. Where lens array 55 does form part of substrate web 10, it could be applied to the web after exposure has taken place, e.g. by lamination. However, it is preferred that the lens array 55 forms part of the unexposed substrate web along with support layer 11 and vesicular film 2. If appropriate, the support layer 11 could be omitted entirely and the vesicular film 2 coated directly on the flat surface of lens array 55.

In this example, the substrate web 10 is shown as further comprising a shielding layer 12 which protects the exposed vesicular film 2 from wavelengths of radiation to which it is responsive. As discussed above with respect to FIG. 8, this can take the form of a UV-absorbing lacquer. The lens array 55 itself may also be absorbent to the radiation wavelength in question, thereby acting as a second shielding layer such that the vesicular film 2 is protected from both sides. In this case, one or other of the lens array and the shielding layer 12 must be applied after the vesicular film has been exposed to the radiation and typically this will be the shielding layer 12.

At least the lens array 55 and support layer 11 are substantially visually transparent, and the pattern of exposed regions 3 on the vesicular film 2 is located at approximately the focal length f of the lens array 55. When viewed through the microlens array 55, the device therefore exhibits a focussed version of the pattern exhibited by vesicular layer 2. Depending on the design of the pattern, the focussed image could be substantially the same at all different viewing positions. However, in preferred examples, the pattern formed on vesicular layer 2 comprises interleaved portions of more than one image in much the same way as described above with reference to the FIG. 10 embodiment. In this way, when viewed from a first viewing position 1 shown in FIG. 11, only portions of a first image will be focussed, whereas when viewed from a second viewing position 2, portions of a second, different, image will be focussed. The result is a device which exhibits a focussed, reconstructed image which appears to switch appearance when the device is tilted beyond a certain angle. The device could be a one-dimensional lenticular device, whereby the switch effect is only perceived when the device is tilted about one axis. In this case, the lens array could consist of cylindrical lenses and the interleaved image portions may be slices (as in the FIG. 10 embodiment).

As in the FIG. 10 embodiment, the aspect ratio of the distance between viewing component 55 and the vesicular film 2 (here, the focal length f) to the spacing, s, between the pattern elements 3 on vesicular film 2 determines the angle at which the switch will be perceived. The higher the ratio of f:s, the smaller the change in viewing angle necessary in order to perceive the change in images. Therefore, forming the pattern elements 3 on a vesicular film as described above enables the spacing s to be reduced to a level far outperforming that achievable using conventional patterning techniques such as printing. This either can be utilised to obtain a higher aspect ratio of f:s without substantially changing the thickness of the device, leading to an enhanced optical effect, or to permit a reduction in the thickness of the device (provided lenses of suitable focal length are available) whilst still achieving a high impact optical switch.

FIGS. 12a and 12b shows an example of a lenticular device formed based on the principles described above, viewed from two different angles. FIG. 12a shows the appearance of the device when viewed directly from above and it will be seen that a focussed, reconstructed image of a dog is visible. In contrast, when the same device is viewed from an angle, an image of a cat is visible.

Of course, the lenticular device could be configured to carry multiple sequential images if desired, thus appearing as an animated feature as in the FIG. 10 embodiment. Further examples of lenticular devices that can be constructed using the above described principles are given in our International Patent Application No. WO-A-2011051670.

A fourth embodiment of a security device is depicted in cross-section in FIG. 13. Here, the device is a moiré magnification device, the principles of operation of which are described in EP-A-0698256, WO2005106601A2 and in our International Patent Application Number PCT/GB2011/050398. The device comprises a viewing component in the form of regular microlens array 60, which in this example comprises an array of spherical microlenses such that a two-dimensional effect is achieved, although a one-dimensional version utilising cylindrical lenses is also envisaged. In this example, the microlens array is depicted as forming part of the substrate web 10 but, as in the previous embodiments could alternatively be provided as part of an object of value to which the substrate web 10 is applied. The multilayer structure of the device is otherwise generally similar to that of the lenticular device described above with reference to FIG. 11, with the patterned vesicular film 2 being located in the focal plane of the lenses 60, spaced by an optional transparent support layer 11. A shielding layer 12 may be provided and, as before, the microlens array 60 may also be opaque to radiation wavelengths to which the vesicular film 2 is responsive.

The pattern P carried by the vesicular film 2 comprises an array of microimage elements and an example of such an array is depicted in FIG. 14a. Here, each microimage element depicts a numeral "5". The dotted line circles represent the position of the microlenses relative to the image elements. The microlenses have a pitch $Q_1$ which differs from the pitch $Q_2$ of the microimage array. This pitch mismatch gives rise to a magnification effect whereby each lens magnifies a different portion of the neighbouring microimage array elements, thereby forming in combination a magnified version of the array on a virtual image surface which appears in front of or behind the device. An example of such a magnified image panel is shown in FIG. 14b, and it will be seen that the magnified elements M are of generally the same appearance as the microimage elements provided in the pattern P (but of course much greater in dimension). The degree of magnification achieved depends on the degree of pitch mismatch between the arrays.

As the device is tilted, different portions of each microimage element become magnified, and the magnified image panel therefore appears to move relative to the security device. Various additional effects can be achieved through design of the pattern to which the vesicular film 2 is exposed, and examples of such effects and suitable microimage arrays through which they can be achieved are disclosed in our International patent application number PCT/GB2011/050398.

It should be noted that it is not essential that the microlens and microimage arrays have differing pitches. Instead, a suitable mismatch between the two arrays can be achieved by rotating one array relative to the other, which will also give rise to moiré magnification.

Lenticular and moiré magnification devices such as those depicted in FIGS. 11 and 13 may alternatively be formed using focussing mirror arrays in place of the described microlens arrays 55, 60. In this case, the array of mirrors would be disposed underneath the exposed vesicular film 2. The use of focussing mirror arrays in lenticular and moiré magnification devices is described in WO-A-2011107793.

The above-described devices each make use of the capacity of vesicular film to display a pattern of relatively light and relatively dark regions due to the described increase in optical density resulting from the formation of gas bubbles within the film. However, the present inventors have found that, if sufficient dosages of radiation and heat are applied, the exposed regions of the vesicular film will not only undergo an increase in optical density, but will also exhibit a raised surface relief relative to the unexposed regions of the film. FIG. 15 shows a cross-section through a pattern on a vesicular film which shows this raised profile. Here, the exposed region 3 is bounded on either side by unexposed regions 4 and in these regions the film 2 retains its original thickness. In this example, the film 2 forms part of a substrate web 10 which is mounted on a backing sheet B. It will be seen that the exposed region 3 has a raised surface profile, and it is believed that this arises due to expansion of the material caused by the growth of the gas bubbles upon heating.

The cross section shows the profile to have gently sloping sides and a maximum height at approximately the centre of the element. In this example, the maximum height, h, is around 25 µm. The lateral width of the exposed region 3 is around 300 µm. Experiments have shown that the maximum height of the exposed regions depends on the lateral size of the exposed region (e.g. the line width) as well as on the exposure temperature. The feature height may also be influenced by exposure conditions (e.g. radiation intensity and duration) as well as the duration of heating. FIGS. 16a and 16b are plots showing exemplary empirical data indicating the dependence of feature height on line width (FIG. 16a) and on heating temperature (FIG. 16b). In both cases, the afore-mentioned vesicular film supplied by Exopack with a thickness of about 5 µm was used. The maximum feature height is shown to increase slightly with increasing line width, between about 10 µm and about 30 µm for line widths ranging from 30 to 80 µm. This data was obtained using a constant heating temperature of 125° C. and duration of 45 seconds, following exposure to approximately 100 mJ of radiation (i.e. use of the previously described apparatus at a radiation source dial-setting speed of 10, slot width 8 mm and transport speed 15 meters per minute). FIG. 16b shows that the maximum feature height has a stronger dependence on heating temperature, varying from a maximum height of less than 5 µm at heating temperatures around 80° C. to a maximum feature height of nearly 30 µm at around 135° C. This data was obtained using features having a constant line width of 70 µm and a constant heating duration of 45 seconds. The radiation exposure parameters are the same as those used to prepare the data in FIG. 16a.

Thus, through control of the radiation and heating parameters, the exposed, high optical density elements of the patterned vesicular film can be configured to possess a raised surface relief which can be employed to provide a further range of secure visual effects. Two examples of security devices which utilise this characteristic of the exposed vesicular film will now be described with reference to FIGS. 17 and 18.

FIG. 17 depicts a fifth embodiment of a security device which in this case is formed wholly on the substrate web 10. The substrate 10 is depicted as consisting of support layer 11 and vesicular film 2 but in practice may also comprise additional layers such as one or more shielding layers above or below the vesicular film 2 as described previously with reference to FIG. 8.

The vesicular film 2 has been exposed to form a pattern of line elements 3 spaced by intervening gaps 4. The exposed regions 3 exhibit both a high optical density relative to the unexposed regions 4 and a raised surface profile of maximum height h. When viewed directly from above, from the position of observer (i), the device will appear to have a substantially uniform optical density which is approximately the average of that of the exposed regions 3 and that of the unexposed regions 4 (assuming the width w of the lines 3 is substantially equal to the spacing s between them). When the same device is viewed from position (ii) orthogonal to the line elements, the raised nature of the exposed lines 3 causes the intervening spaces 4 to be concealed, thus giving the device the appearance of an overall higher optical density. However, when the same device is viewed from a third position (iii) aligned with the line elements 3, the appearance will be similar to that from observing position (i), since the geometry of the elements is such that there will be no concealment of the spaces 4. As such, the device has an appearance which will change at selected angles of view.

The effect described above can be viewed either in transmission, since the unexposed vesicular film is largely transparent to visible light, or in reflection (if for example the device is fitted on top of a light background). FIG. 18 is an example of a device operating on similar principle which is particularly suited to viewing in transmission although similar effects could also be achieved in reflection. FIG. 18(*a*) shows a plan view of the security device and for clarity only the pattern on the vesicular film is shown (the structure of the substrate web in which it is carried being largely as before). Here, there are two areas of raised pattern elements, $A_1$ and $A_2$. In FIG. 18, the pattern elements of each area are denoted in different colours. However, it will be appreciated that in fact the pattern elements will all have the same optical density. The different colours are utilised in the Figures to indicate the appearance of the feature at different viewing angles.

In this example, the first area $A_1$ consists of a set of line elements forming the background to an image defined by area $A_2$ in which the line elements are orientated substantially orthogonally to the background lines. When the feature is viewed directly in line with a light source (i.e. the light source is directly behind the feature and in line with the viewer) no image will be visible since the whole area of the device will possess substantially the same average optical density. However, when the device is viewed in transmission with a light source slightly to one side (i.e. not directly behind the image), the light will tend to reflect off and thereby illuminate the lines which are perpendicular to the direction of the incoming light rays. In the viewing position shown in FIG. 18(*a*), the background lines forming area $A_1$ are positioned to reflect the light and hence this area $A_1$ appears lighter than the foreground area $A_2$. The image defined by area $A_2$ therefore appears dark against a light background. When the device is rotated through 90° relative to the light source, as shown in FIG. 18(*b*), the appearance switches. Now, the lines forming the background area $A_1$ are parallel to the direction of the incoming light rays and hence appear dark whilst the line elements forming the foreground image $A_2$ reflect the light rays and therefore appear bright. This provides an easily testable optical effect which, provided the other layers of the substrate web are also transparent, can be viewed from either side of the device.

In FIGS. 17 and 18, the raised elements are line elements. However, similar effects can alternatively be achieved using different element shapes aligned along lines which are transversely spaced from one another. For example, each line could be made up of a series of discontinuous raised elongate elements, or of a series of raised "dots" to form a dotted line. The lines could be straight, curved, sinusoidal or otherwise but generally the lines within each area are substantially parallel to one another.

It should be noted that the above-described latent devices described with reference to FIGS. 17 and 18 differ from conventional latent devices not only through the use of vesicular film to form the raised elements but also in that the elements are (or at least can be) formed on a substantially visually transparent substrate. As a result, the latent effects are visible from either side of the device, which has not previously been possible. This significantly enhances the visual impact of the device. Whilst it is preferred that the latent device is formed using vesicular film in the above-described manner, it is envisaged that alternative techniques resulting in raised elements of relatively high optical density (preferably opaque) on a transparent substrate could be used and are within the scope of this aspect of the invention. For example, the raised elements could be print elements, laid down by intaglio, screen or lithographic printing for example, on a polymer substrate. No vesicular film need be included. Whether the raised elements are formed by exposure of a vesicular film, printing onto a substrate or another method, the height of the raised elements is of the same order as discussed in previous embodiments, e.g. at least 5 microns.

Returning to vesicular-film based devices, further types of optical device can be formed based on interaction between two overlapping patterns and whilst in some cases the second pattern is not required to be at the same high resolution as the first (such as the animation device described above with reference to FIG. 10), in other examples similar levels of resolution will be necessary. Another class of security device therefore includes two overlapping vesicular films, each carrying a pattern of exposed regions. The devices could be constructed by separately exposing two substrate webs, each comprising a vesicular film, and then assembling the two exposed substrate webs together with the patterns in the desired alignment. Alternatively, the two desired patterns could be produced sequentially on one vesicular film through appropriate design of the mask used in the processes described above. The various sections of the vesicular film could then be arranged to overlap one another, either by cutting the vesicular film into sections and assembling as appropriate or folding the vesicular film at the interface between the two designs.

Alternatively, the substrate web can be configured to carry two vesicular films and examples of suitable (unexposed) substrate web constructions are shown in FIGS. 19(*a*) and 19(*b*). In FIG. 19(*a*), the substrate web comprises a support layer 11 as previously described carrying a vesicular film 2, 2' on each of its surfaces. In this example, each vesicular film 2, 2' is a contiguous layer covering substantially the whole area of the support layer 11, but this is not essential. As previously described, the support layer 11 is typically transparent to both visible light and the wavelengths of radiation to which the vesicular films are responsive. In this case, exposure of one vesicular film 2 will automatically expose the other 2' (unless the two vesicular films are responsive to different wavelengths) and, although this is desirable for the production of certain security devices such as that described below with reference to FIG. 20, this may not always be the case. Therefore, FIG. 19(*b*) shows an alternative substrate web 10 which further comprises a shielding layer 14 located between the support layer 11 and one of the vesicular films 2'. The shielding layer 14 is substantially opaque to radiation wavelengths to which the vesicular films 2, 2' are responsive and can comprise for example a UV absorbent lacquer. With this construction, exposure of one vesicular film 2 will not automatically lead to exposure of the second vesicular film 2'.

An example of a security device formed using the substrate web construction shown in FIG. 19(*a*) will now be described with reference to FIG. 20. As shown in FIG. 20(*a*), when the substrate web 10 is exposed to the radiation through a mask 20 using the processes described above, both vesicular films 2 and 2' will be exposed to the same pattern and exhibit exposed regions 3 and 3' exactly in registration with one another. After heating, as shown in FIG. 20(*b*), the two vesicular films 2 and 2' will therefore exhibit the same pattern, P. This produces a venetian blind effect device whereby, when viewed directly on-axis, the device will appear to have a uniform optical density which is approximately the average of the optical density of the exposed regions and that of the unexposed regions, assuming the width of the exposed regions is the same as that of the spaces in between them. When the device is viewed at an angle as depicted by observer (ii) in FIG. 20(*b*), the two patterns will interact with one another so as to block the passage of light through the device, thereby changing the overall appearance of the device and making it appear relatively dark. The angle at which the switch will be visible depends on the spacing between the two vesicular patterns, which here is determined by the thickness t of support layer 11, as well as the lateral width w of the pattern elements and the spacing s between them. Generally, at least a one-to-one aspect ratio is desirable in order to avoid the effect being visible only at very high tilt angles.

More complex security effects will generally require the provision of two different patterns, or at least two out of phase patterns, in the first and second vesicular films respectively. FIGS. 21 and 22 show two alternative modifications to the apparatus used for manufacturing the security devices discussed above with reference to FIGS. 4 and 5 to enable the production of different patterns in each of the vesicular films in one on-line process. In FIG. 21, two patterning rollers 25 and 25' are provided on either side of the transport path along which the substrate web 10 is conveyed, defining a nip therebetween. Each patterning roller 25, 25' is constructed as already described, carrying a mask 20, 20' defining a respective pattern, $P_1$ and $P_2$. On passing through the nip defined between the two patterning rollers 25, 25', the substrate web 10 containing an internal shielding layer 14 is exposed from both sides to radiation 30 and 30' of appropriate wavelengths for producing a pattern in vesicular films 2 and 2' respectively. In this configuration, each location along the length of the substrate web 10 is patterned simultaneously on both sides, thereby achieving highly accurate registration between the two patterns.

In an alternative embodiment, shown in FIG. 22, the second patterning roller 25' could be positioned downstream of the first patterning roller 25 with the transport path arranged to include a portion of the circumferential surface of the second patterning roller 25' also. The two vesicular films 2 and 2' can then be imaged sequentially which may not achieve the same levels of registration between the two patterns but may reduce the risk of slippage occurring between the masks and the substrate web 10.

Examples of security devices which use two overlapping patterns formed in overlying vesicular films will now be described with reference to FIGS. 24 to 26. However, it should be noted that similar devices can be constructed using a single vesicular film pattern in combination with a second pattern carried, for example, by an object of value into which the vesicular film is ultimately incorporated which may or may not be formed on vesicular film since it could for example comprise a print or a metallisation.

FIG. 23 shows a seventh embodiment of a security device in cross-section, comprising first and second vesicular films 2 and 2' positioned on either side of a transparent support layer 11 to form a substrate web 10. Vesicular layer 2 has been exposed to a first pattern $P_1$ whereas vesicular film 2' has been exposed to a second pattern $P_2$. In this example, the device has two laterally offset regions A and B. In region A, the exposed pattern elements of pattern $P_1$ and pattern $P_2$ are identical and aligned with one another, as in the FIG. 20 device. In area B the patterns $P_1$ and $P_2$ are identical in pitch but 180° out of phase with one another such that the exposed regions of the first vesicular film 2 forming pattern $P_1$ align with the unexposed regions of the second vesicular film 2' forming second pattern $P_2$, and vice versa.

When viewed in transmission from directly above, observer (i) will perceive region A as having a lower optical density then region B where light transmission is blocked by the interplay between the two patterns. In contrast, when viewed from an angle at the position of observer (ii), area A will appear relatively dark compared with area B, since light will now be able to pass through aligned transparent regions of patterns $P_1$ and $P_2$ in area B, whereas it will be blocked by the alignment between pattern elements in area A. This "contrast flip" between areas A and B provides an easily testable, distinctive effect. In order for the switch to be observable at relatively low tilt angles, the aspect ratio of the support layer thickness t relative to the spacing of the pattern elements s should again be at least one-to-one. It should be noted that it is not essential to ensure an entirely accurate registration between the two patterns $P_1$ and $P_2$ since provided the sizing of the pattern elements is correct, a switch in contrast between the two regions will still be visible as the device is tilted.

FIG. 24 provides a further example of a security device operating on the same principles as that described with reference to FIG. 23, although in this case the upper pattern $P_2$ is formed as a print 65 on a document of value which overlies the substrate web 10 carrying just one vesicular film which has been exposed to pattern $P_1$. Here, the two regions A and B are configured so as to form the foreground and background respectively of a graphic. FIG. 24(a) shows the device viewed straight-on and it will be seen that the line elements forming pattern $P_1$ on the vesicular film are aligned with the printed line elements 65 to a sufficient extent that the region A appears light relative to the background region B where the pattern elements on the vesicular film are largely out-of-line with the printed line elements 65, thus obscuring more of the passage of light. When the device is viewed at an angle, as shown in FIG. 24(b), the relative optical density of the two areas A and B appears to switch, since at this angle in area A the printed lines 65 are not aligned with the lines of the vesicular film pattern, thereby blocking the passage of light, whereas the background B now appears light.

FIG. 25 shows an eighth embodiment of a security device in cross-section which here takes the form of a moiré interaction device. In this embodiment, two vesicular films 2 and 2' are provided as part of substrate web 10 but as in the previous embodiments, one or other of the patterns provided by the vesicular films could be provided by other means.

To form a moiré interference device, each of the vesicular films 2 and 2' carries a pattern of elements, mismatches between the two patterns combining to form moiré interference fringes. In the example shown, each of the patterns $P_1$ and $P_2$ consists of an array of line elements, with those of one pattern rotated relative to those of the other. In other cases, the mismatch could be provided by a pitch variation rather than a rotation, and/or isolated distortions within one or other of the patterns. When viewed from above such that the two patterns are viewed in combination with one another, moiré interference bands are visible and these will appear to move relative to the device depending on the viewing angle. This is due to the precise portions of the two patterns which appear to overlap changing as the viewing angle changes. For instance, in the example of FIG. 25, when viewed directly from above, portion a of pattern $P_1$ will appear to overlap and therefore interfere with portion b of pattern $P_2$, whereas at a second viewing angle illustrated by observer (ii), the same portion a of pattern $P_1$ will appear to overlap and therefore interfere with a different portion c of the second pattern $P_2$. In order to achieve significant perceived motion at relatively low viewing angles, a high aspect ratio of the spacing between the two patterns (representative by the thickness t of support layer 11) relative to the spacing s of the line elements in each of the patterns is required. For example, where the line elements have a width and spacing of around 5 µm, a thickness t of around 25 µm is suitable. No registration between the two patterns $p_1$ and $p_2$ is required. Forming the patterns on vesicular films enables the production of extremely high resolution pattern elements and therefore low spacing S, achieving very high degree of perceived motion at low viewing angles and/or reduction in the thickness t of the device.

Figure 26A:
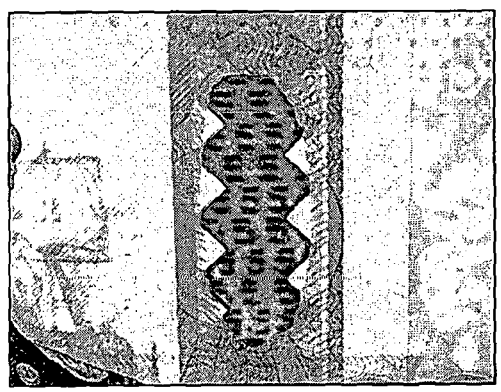
Figure 26B:
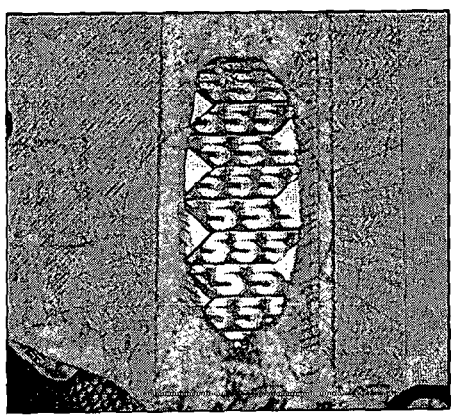
Figure 26C:
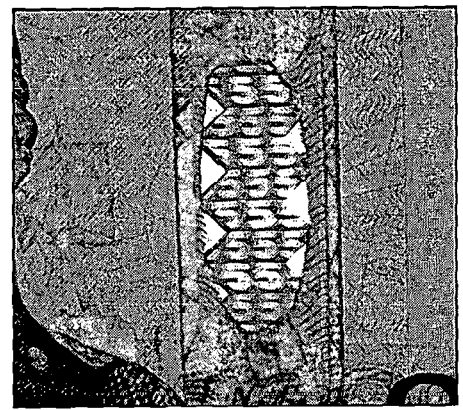

FIG. 26 shows another example of a moiré interference security device formed using principles similar to those described with reference to FIG. 25 under three different viewing conditions. FIG. 26a shows the device in reflected light, and FIGS. 26b and 26c show the same device viewed in transmission at two different viewing angles. Here, the device is a shape moiré interference device in which one of the patterns is a revealing pattern, e.g. a line array, whilst the other is an array of microimage elements, e.g. "5"s. A small mismatch between the two arrays is provided (in terms of pitch and/or rotation) in much the same way as described with respect to the moiré magnification device detailed above. It will be seen that the moiré bands combine to form multiple images of the digit "5" which appear to move from side to side relative to one another as the device is tilted. This is apparent from the relative positions of the "5's" in the two views of the device: FIG. 26c shows approximately straight columns of 5's lining up from top to bottom of the device, whereas in FIG. 26b, the 5's are no longer in line with one another.

Post-exposure processing of the substrate web depends on how the finished security device is ultimately to be formed in or applied to an object of value. Three primary options are: (i) the patterned vesicular film can be processed into a security article, such as a label, foil or thread; (ii) the patterned vesicular film can be directly incorporated into an object of value such as a banknote; or (iii) the substrate web itself carrying the vesicular film could be used as the basis of an object of value.

For example, after the substrate web has been exposed, heated and coated as depicted in FIG. 5, the further processing depicted by block 50 may comprise cutting the substrate web into individual security articles such as threads, strips or labels which can then be individually incorporated into or applied to objects of value. Alternatively the whole length of exposed web may itself constitute a security article, and could be applied to or incorporated into one or more objects of value (e.g. a web of such objects) without the need for any further processing steps. It should be noted that the security articles will each comprise a portion of the patterned vesicular film but this may or may not by itself exhibit a secure visual effect (i.e. the security articles may or may not comprise a security device). For instance, to complete a security device from which the visual effect is apparent, it may be necessary to combine the security article with a viewing component (such as a lens array) provided as part of the object of value itself. In the following examples depicted in FIGS. 27 to 29, it is assumed that this is not the case and the security article itself carries all of the components necessary to perceive a secure optical effect, thereby forming a security device. For instance, the security article may comprise a substrate web having any of the structures depicted in FIG. 1, 8, 10, 11, 13, 17, 20, 23 or 25 discussed above.

FIG. 27 shows an embodiment of an object of value, here a document of value 100 such as a banknote, into which a security article 90 constituting a length of the exposed substrate web bearing a security device is incorporated. The substrate web may be cut into individual security threads 90 before insertion into the security document 100 but in preferred embodiments, a reel of the exposed substrate web 10 may be fed into a paper-making process, for example, to form a web of documents which is then cut into individual documents of the appropriate size. Here, the thread 90 is incorporated as a windowed thread in between first and second plies 101 and 102 of the security document 100, at least one of the plies 101 having a series of windows 91 formed therein either during the paper-making process or subsequently (e.g. by grinding). The windows 91 thereby reveal portions of the security article 90 such that the pattern P carried by the vesicular film is observable through the windows 91. Between the windows 91, sections 92 of the thread 90 are concealed by the overlying document ply 101. Alternatively, the windowing thread could be incorporated into single ply paper and produced using the method described in EP0059056.

FIG. 28 shows an alternative embodiment of a document of value 100, in which the substrate web is formed into strip articles 95 which are mounted to one side of a document substrate 101 in alignment with a window 96 which may be formed before or after application of the strip 95. The pattern P is observable through the window 96 and, depending on the construction of the substrate web from which strip 95 was constructed, it may be visible from the other side of the document 100 also. The strip 95 can be affixed to document ply 101 using an adhesive for example. As in the case of security thread 90, cutting of the substrate web into individual strips 95 may take place before or after incorporation with the document substrate 101.

FIG. 29 shows a further embodiment in which the substrate web has been formed into label articles 97 and affixed to a surface of a document 100. Here, the document substrate 101 may be opaque (e.g. paper), transparent or translucent (e.g. polymer substrate), or some combination thereof. For instance, the document substrate 101 could be transparent in the vicinity of the label 97 and substantially opaque elsewhere. As discussed below, label elements and/or transfer foils such as item 97 can be applied to a document in a number of ways and may not constitute the full layer structure of the substrate web once applied to the document of value 100.

FIG. 30 illustrates an example in which a security device is formed by a pattern carried on the vesicular film in combination with one or more components forming part of the document of value 100 into which the vesicular film has been incorporated (e.g. as a security article). FIG. 30(a) shows a cross section through a portion of document of value 100 with the various layers shown separated from one another for clarity. Here, a portion of exposed substrate web 10 is provided e.g. in the form of a thread, strip or insert, in between plies 101 and 102 of document 100 (although in other examples the web could be applied to one side of the document, as in FIG. 28 above). In the present example, the upper ply 101 is a substantially transparent polymer substrate which has been printed or coated upon most of its surface area 101a, leaving transparent window regions 55 and 65. Each of the window regions reveals a section of substrate web 10 underneath which carries exposed pattern P (although the pattern may be different at the location of each window region). The construction is completed by a second document ply 102 which here is printed over area 102a to define a single window region 70 which aligns with window 65.

Window 55 includes a lenticular array which is designed to co-operate with the underlying pattern P to form a lenticular device 110 based upon the principles discussed above with respect to FIG. 11. The device is primarily viewable in reflection but could be observable in transmission if the print on second document ply 102 is sufficiently translucent. In contrast, window 65 is provided with a printed masking grid which acts in combination with the underlying pattern P to produce an animation effect such as that discussed above with reference to FIG. 10. Of course, any other type of device based on the vesicular patterns can be produced by providing the appropriate viewing components in one or other of the document substrate plies 101 or 102.

FIG. 31 illustrates the case where the substrate web takes the form of a transfer band which may be used to transfer security articles onto an object of value either in the form of transfer films or foils, or as labels/stickers. FIG. 31(a) shows a hot stamping approach in which the substrate web comprises a microtext device such as that described with reference to FIG. 9 above. In this case, the vesicular film 2 carrying the patterned microtext is positioned underneath transparent support layer 11 which sits on a carrier band 19 having a release layer 18 (e.g. wax). An adhesive layer 17 is provided over the vesicular film 2. An appropriately shaped stamp 120 can then be used to transfer portions of the exposed substrate web onto objects of value 100, releasing the device structure from the carrier film 19. FIG. 31(b) depicts an alternative transfer band configuration with a lenticular device structure, here incorporating a lenticular array 55 and patterned vesicular film 2 disposed on the rear surface of the lens array, arranged to produce for example a moiré magnification effect as discussed above with reference to FIG. 13. The structure is formed in isolated regions on a transfer band 19 equipped with an adhesive layer 17 and release layer 18. Each individual article can be removed from the transfer band as a label/sticker and adhered to the surface of an object of value 100. FIG. 31(c) shows another exemplary label structure in which the substrate web 10 includes an optical structure such an a moiré interference device as discussed with reference to FIG. 25 above, provided with an adhesive layer 17 on a carrier film 19 provided with release layer 18. In this case the individual label articles are not spaced from each other on the transfer band. The optical layers can be pre-cut into desired shapes to form labels which can then be individually peeled off the carrier film 19 and placed using a manual or automated process on an object of value, affixed by means of adhesive layer 17. As for other types of security article, the transfer bands described here need not include all of the components necessary to generate the optical effect since the foil/label could be transferred onto an object in alignment with a viewing component incorporated into the document or applied later. Depending on the construction of the substrate web, however the optical structure is applied to the object of value, it may be appropriate to protect the vesicular films from further irradiation by the provision of a further shielding layer 75 which could take the form of a laminate or a further lacquer coating.

In each of the above examples, the pattern is formed on a substrate web which is then incorporated into or applied onto an object of value in the form of a security article. However, it is entirely possible to form the vesicular pattern integrally with an object of value, such as a document of value, and an example of how this might be achieved will now be described with reference to FIG. 32.

Figure 32A:
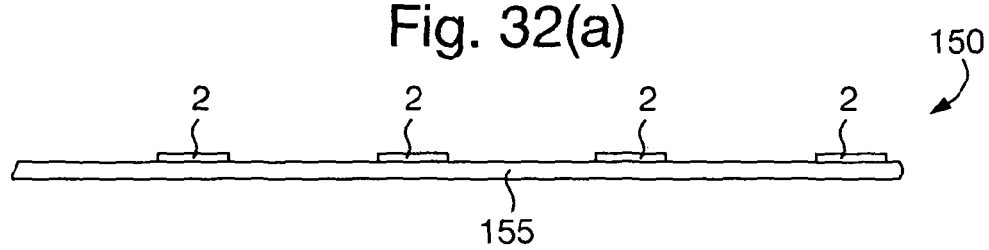
Figure 32B:
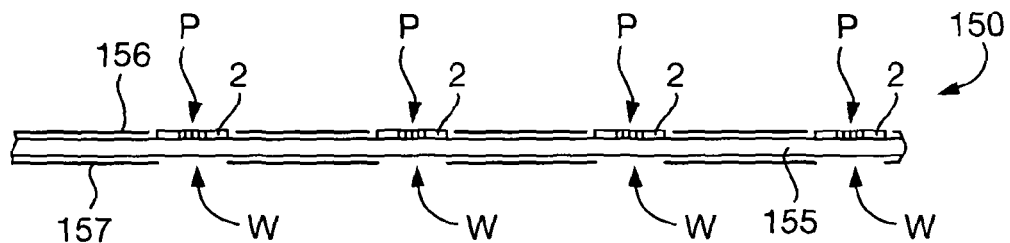

FIG. 32(a) depicts a section of a substrate web 150 comprising a support layer 155 with isolated regions of vesicular film 2 applied thereon. Here, the support layer 155 is a conventional document substrate material such as a polymer banknote substrate or paper. The support layer 155 may or may not be pre-printed and may or may not already carry one or more additional security devices such as magnetic threads. The substrate web 150 is processed as described above with reference to FIGS. 4 and 5 such that a pattern P is transferred into each vesicular film portion 2. The result is shown in FIG. 32(b). In this example, as also shown in FIG. 32(b), the support layer 155 is then coated on both sides with an opaque layer 156/157 which omits the vesicular film portions 2 and a region of the opposite side of the support layer 155 such that a window is formed surrounding each vesicular pattern P (assuming the support layer 155 is visually transparent or translucent). Alternatively, such a coating could be provided before the exposure takes place. If the support layer 155 is inherently opaque, if desired, a window could be ground through the support layer in alignment with the vesicular film pattern or the security device could be designed for viewing in reflected light. One or more shielding layers which are visually transparent but block radiation to which the vesicular film is responsive will typically also be provided as discussed with reference to FIG. 8 above.

Figure 32C:
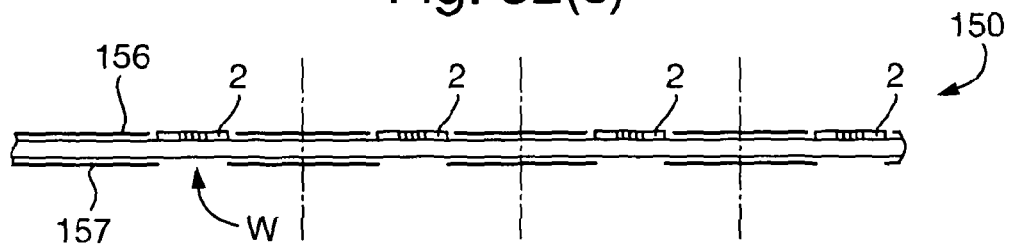
Figure 32D:
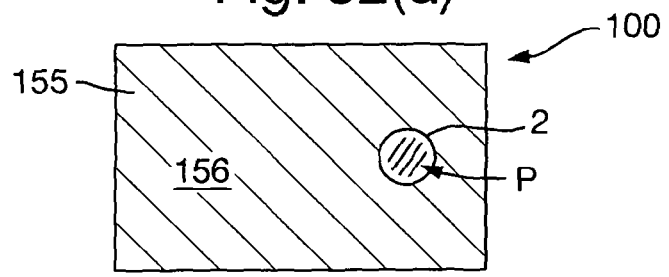

The so-formed web can then be subjected to any further processing steps necessary, such as the application of individual serial numbers or printing of personalisation data, before being cut into individual documents of value as indicated by the broken lines in FIG. 32(c). The result, as shown in FIG. 32(d), is a document of value integrally comprising a security device based on a patterned vesicular film 2.

In all of the above embodiments, other security features such as holograms, kinegrams, magnetic features, luminescent or fluorescent substances and optically variable materials including inference layer structures and pigments can be incorporated into the substrate web to further enhance the security level. Such additional features may or may not overlap the pattern carried by the vesicular film provided the pattern remains at least partially visible such that the desired secure visual effect based on the pattern can still be observed.

The invention claimed is:

1. A method of manufacturing at least part of a security device, the method comprising:
    conveying a substrate web comprising a photosensitive film along a transport path, the photosensitive film being adapted to exhibit an increase in optical density upon exposure to radiation of a predetermined wavelength and concurrent or subsequent heating, the increase in optical density being due to the formation of bubbles within the photosensitive film;
    exposing the photosensitive film to radiation of the predetermined wavelength through a mask, wherein the mask comprises a predetermined pattern of regions which are substantially opaque to radiation of the predetermined wavelength and at least semi-transparent to radiation of the predetermined wavelength, respectively;
    during the exposure, moving the mask alongside the substrate web along at least a portion of the transport path at substantially the same speed as the substrate web, such that there is substantially no relative movement between the mask and the substrate web; and
    heating the substrate web comprising the exposed photosensitive film;
    whereby regions of the photosensitive film exposed to the radiation of the predetermined wavelength undergo an increase in optical density such that the photosensitive film displays a reproduction of the predetermined pattern.

2. A method according to claim 1, wherein the substrate web comprises a support layer on which the photosensitive film is carried.

3. A method according to claim 2, wherein the support layer is at least semi-transparent to radiation of the predetermined wavelength.

4. A method according to claim 2, wherein the support layer is substantially transparent in the visible spectrum.

5. A method according to claim 1, wherein the mask is provided on a circumferential surface of a patterning roller, and the transport path includes at least a portion of the circumferential surface of the patterning roller, and wherein at least during the exposing of the photosensitive film to radiation, the patterning roller rotates such that its circumferential surface travels at substantially the same speed as the substrate web.

6. A method according to claim 1, wherein the exposure of the photosensitive film to radiation and the heating of the substrate web in combination are sufficient to give rise to a raised surface relief in the exposed regions of the photosensitive film.

7. A method according to claim 6, wherein the predetermined pattern displayed by the photosensitive film comprises a plurality of spaced exposed regions of increased optical density, each exposed region having a raised surface relief, configured such that the appearance of the predetermined pattern varies depending on the viewing angle due to the raised regions concealing the intervening spaces to a greater or lesser extent, whereby the predetermined pattern forms a latent device.

8. A method according to claim 7, wherein the distance by which the regions are spaced is substantially equal to the maximum height of the regions.

9. A method according to claim 1, wherein the predetermined pattern is configured to exhibit a secure visual effect, alone or in combination with a viewing component such as a second pattern, a focussing element or array of focussing elements.

10. A method according to claim 9, wherein the secure visual effect is an optically variable effect, exhibited by the predetermined pattern alone or in combination with a viewing element.

11. A method according to claim 1 wherein the substrate web further comprises a shielding layer on one side of the photosensitive film which is substantially opaque to radiation of the predetermined wavelength, the photosensitive film being located between the shielding layer and the mask during exposure.

12. A method according to claim 11, wherein the substrate web comprises a support layer on which the photosensitive film is carried and the support layer is substantially opaque to radiation of the predetermined wavelength, thereby acting as the shielding layer.

13. A method according to claim 1 further comprising, after exposing the photosensitive film, applying a shielding layer to one or both sides of the substrate web at least in the vicinity of the displayed pattern, the shielding layer being substantially opaque to radiation of the predetermined wavelength.

14. A method according to claim 13 wherein the shielding layer is at least semi-transparent in the visible spectrum.

15. A method according to claim 1, further comprising, after the heating step, deactivating the photosensitive film by:

(i) exposing the photosensitive film to radiation of the predetermined wavelength; and then
(ii) maintaining the exposed photosensitive film at temperatures sufficiently low to so as not to give rise to the formation of bubbles for a sufficient duration after which elevation to higher temperatures does not cause the formation of bubbles.

16. A method according to claim 1, wherein the substrate web comprises the first and second photosensitive films, separated by one or more layers which are at least semi-transparent in the visible spectrum.

17. A method according to claim 16, wherein the predetermined pattern(s) displayed by the first and second photosensitive films form in combination a venetian blind device whereby the appearance of the device differs at different angles of view.

18. A method according to claim 16, wherein the predetermined patterns displayed by the first and second photosensitive films form in combination a moiré interference device whereby the appearance of the device differs at different angles of view.

19. A method according to claim 16, wherein at least one of the one or more layers separating the first and second photosensitive films is substantially opaque to radiation of the predetermined wavelength, whereby only the first photosensitive film is exposed to radiation through the predetermined pattern during the exposure step, and the method further comprises:

exposing the second photosensitive film to radiation of the predetermined wavelength through a second mask, the second mask comprising a second predetermined pattern of regions which are substantially opaque to radiation of the predetermined wavelength and at least semi-transparent to radiation of the predetermined wavelength, respectively; and during the exposure of the second photosensitive film, moving the second mask alongside the substrate web along at least a portion of the transport path at substantially the same speed as the substrate web, such that there is substantially no relative movement between the second mask and the substrate web, whereby, after heating, the first photosensitive film displays a reproduction of a first predetermined pattern defined by the mask through which the first photosensitive film is exposed, and the second photosensitive film displays a reproduction of the second predetermined pattern.

20. A method according to claim 1, wherein the substrate web further comprises one or more focussing elements, or the method further comprises arranging one or more focussing elements to overlap the substrate web, the photosensitive film lying substantially in the focal plane of the focussing element(s), whereby a focussed image of at least part of the predetermined pattern is generated.

21. A method according to claim 20, wherein the focussing element(s) and predetermined pattern displayed by the photosensitive film form in combination a lenticular device.

22. A method according to claim 21, wherein the predetermined pattern comprises elements of a first image and elements of a second image arranged such that when the lenticular device is viewed from a first angle, a focussed version of the first image is generated, and when the lenticular device is viewed from a second angle, a focussed version of the second image is generated.

23. A method according to claim 1, wherein the substrate web further comprises a regular array of micro-focussing elements, or the method further comprises arranging a regular array of micro-focussing elements to overlap the substrate web, the photosensitive film lying substantially in the focal plane of the micro-focussing elements, and the predetermined pattern displayed by the photosensitive film comprising a corresponding array of microimage elements, wherein the pitches of the micro-focusing elements and the array of microimage elements and their relative locations are such that the array of micro-focusing elements cooperates with the array of microimage elements to generate a magnified version of the microimage elements due to the moiré effect, the array of micro-focussing elements and predetermined pattern forming in combination a moiré magnification device.

24. A method according to claim 1, wherein the exposed substrate web constitutes a security article for application onto or incorporation into an object of value.

25. A method according to claim 24, further comprising applying the exposed substrate web onto or incorporating the substrate web into a sheet material to form a security sheet suitable for the production of documents of value.

26. A method according to claim 24, further comprising applying the security article to or incorporating the security article into an object, the object comprising a viewing component aligned with at least part of the reproduction of the predetermined pattern, whereby the viewing component and the predetermined pattern in combination exhibit a secure visual effect.

27. A method according to claim 24, wherein the security article takes the form of a thread, strip or band.

28. A method according to claim 1, wherein the exposed substrate web constitutes one or more objects of value.

29. A method according to claim 28, further comprising cutting the substrate web into individual objects, each object displaying at least one reproduction of the predetermined pattern.

* * * * *